US012702066B2

(12) United States Patent
Jeong et al.

(10) Patent No.: US 12,702,066 B2
(45) Date of Patent: Aug. 4, 2026

(54) DISPLAY APPARATUS

(71) Applicant: SAMSUNG ELECTRONICS CO., LTD., Suwon-si (KR)

(72) Inventors: Juyeon Jeong, Suwon-si (KR); Jongin Yang, Hwaseong-si (KR); Jinsub Lee, Suwon-si (KR); Suhyun Jo, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 636 days.

(21) Appl. No.: 18/094,512

(22) Filed: Jan. 9, 2023

(65) Prior Publication Data

US 2023/0282631 A1     Sep. 7, 2023

(30) Foreign Application Priority Data

Jan. 28, 2022     (KR) ........................ 10-2022-0013075

(51) Int. Cl.
H10W 90/00          (2026.01)
H10H 29/14          (2025.01)
          (Continued)

(52) U.S. Cl.
CPC .......... H10W 90/00 (2026.01); H10H 29/142 (2025.01); H10W 72/242 (2026.01);
          (Continued)

(58) Field of Classification Search
CPC ........... H01L 24/05; H01L 2224/13181; H01L 2224/16145; H01L 2224/13147; H01L 2224/05573; H01L 2224/13021; H01L 25/18; H01L 25/167; H01L 24/16; H01L 24/13; G09G 2300/0426; G09G 2300/0452; G09G 3/32; G09G 3/3216; H10H 20/831;

(Continued)

(56) References Cited

U.S. PATENT DOCUMENTS 6,372,608 B1     4/2002   Shimoda et al.
6,645,830 B2    11/2003   Shimoda et al.
          (Continued)

FOREIGN PATENT DOCUMENTS

KR     10-2017-0100999 A     9/2017
KR     10-2019-0137458 A    12/2019

*Primary Examiner* — Vongsavanh Sengdara
(74) *Attorney, Agent, or Firm* — Muir Patent Law, PLLC

(57)          ABSTRACT

A display apparatus includes a circuit board having a driving circuit, and a pixel array on the circuit board, and including pixel units including a plurality of sub-pixels. The pixel array further includes a semiconductor stack including a first semiconductor region on the circuit board and divided into a plurality of LED cells, and a second semiconductor region on the first semiconductor region and having a partition structure defining a plurality of sub-pixel spaces, a plurality of wavelength converters respectively disposed in the plurality of sub-pixel spaces, a partition reflective layer having a first portion on an upper surface of the partition structure, and a second portion on sidewalls of the partition structure, the first portion having a thickness greater than a thickness of the second portion, and a first electrode and a second electrode electrically connecting each of the plurality of LED cells to the driving circuit.

20 Claims, 23 Drawing Sheets

(51) Int. Cl.
  *H10W 72/20* (2026.01)
  *H10W 72/90* (2026.01)

(52) U.S. Cl.
  CPC .......... *H10W 72/252* (2026.01); *H10W 72/90* (2026.01); *H10W 90/722* (2026.01)

(58) Field of Classification Search
  CPC .............. H10H 20/855; H10H 20/857; H10H 20/8513; H10H 29/142; H10W 90/00; H10W 90/722; H10W 72/242; H10W 72/252; H10W 72/90
  See application file for complete search history.

(56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 10,403,608 B2 | 9/2019 | Sim et al. | |
| 10,700,246 B2 | 6/2020 | Sim et al. | |
| 10,892,298 B2 | 1/2021 | Sakong et al. | |
| 10,998,375 B2 | 5/2021 | Lee et al. | |
| 11,060,689 B2 | 7/2021 | Kwon et al. | |
| 2012/0268631 A1 | 10/2012 | Takase et al. | |
| 2017/0250316 A1 | 8/2017 | Yeon et al. | |
| 2019/0326349 A1* | 10/2019 | Kwon | H10H 29/142 |
| 2020/0105980 A1* | 4/2020 | Sim | H10H 20/856 |
| 2020/0408936 A1 | 12/2020 | Tanino et al. | |
| 2021/0126045 A1* | 4/2021 | Yeon | H10H 29/142 |
| 2021/0210656 A1 | 7/2021 | Yang et al. | |

* cited by examiner

DISPLAY APPARATUS

CROSS-REFERENCE TO RELATED APPLICATION

This application claims the benefit under 35 U.S.C. 119 (a) of Korean Patent Application No. 10-2022-0013075 filed on Jan. 28, 2022, in the Korean Intellectual Property Office, the entire disclosure of which is incorporated herein by reference for all purposes.

BACKGROUND

1. Field

Embodiments relate to a display apparatus.

2. Description of the Related Art

Semiconductor light emitting diodes (LEDs) are used not only as light sources for lighting devices, but also as light sources for various electronic products. For example, the LED is widely used as a light source for various display apparatuses such as a TV, a mobile phone, a PC, a notebook PC, a PDA, or the like.

Existing display apparatuses are mainly comprised of a display panel comprising a liquid crystal display (LCD) and a backlight, but recently, LEDs are being used as pixels to be developed in a form that does not require a separate backlight. Such a display apparatus may be miniaturized, and a high-brightness display apparatus having superior light efficiency compared to LCD may be implemented.

SUMMARY

According to an embodiment, a display apparatus includes a circuit board having a driving circuit; and a pixel array disposed on the circuit board, and including pixel units, each of the pixel units having a plurality of sub-pixels and a plurality of light emitting diode (LED) cells respectively corresponding to the plurality of sub-pixels. The pixel array further includes, a semiconductor stack including a first semiconductor region on the circuit board and a second semiconductor region on the first semiconductor region, wherein the first semiconductor region is divided into a plurality of portions, the plurality of divided portions respectively provided to the plurality of LED cells, and the second semiconductor region includes a partition structure defining a plurality of sub-pixel spaces, the plurality of sub-pixel spaces respectively corresponding to the plurality of LED cells; a plurality of wavelength converters respectively disposed in the plurality of sub-pixel spaces; a partition reflective layer having a first portion on an upper surface of the partition structure, and a second portion on sidewalls of the partition structure, the first portion having a thickness greater than a thickness of the second portion; a passivation layer disposed on lower surfaces and side surfaces of the plurality of LED cells; and a first electrode and a second electrode disposed on the passivation layer, and electrically connecting each of the plurality of LED cells to the driving circuit.

According to an embodiment, a display apparatus includes a circuit board having a driving circuit, and first bonding electrodes connected to the driving circuit; and a pixel array disposed on the circuit board, and having a display area in which pixel units are arranged, and a peripheral area adjacent to the display area, each of the pixel units including a plurality of sub-pixels. The pixel array includes a plurality of LED cells arranged to correspond to the plurality of sub-pixels in the display area, each of the plurality of LED cells including a first conductivity-type semiconductor layer, an active layer, and a second conductivity-type semiconductor layer; a partition structure disposed on the plurality of LED cells, and providing a plurality of sub-pixel spaces in regions respectively corresponding to the plurality of LED cells; a plurality of wavelength converters disposed in the plurality of sub-pixel spaces, respectively; a partition reflective layer having a first portion on an upper surface of the partition structure, and a second portion on sidewalls of the partition structure, the first portion having a thickness greater than a thickness of the second portion; a passivation layer disposed on lower surfaces and side surfaces of the plurality of LED cells; a first reflective electrode disposed on the passivation layer, extending along a region between the plurality of LED cells, and electrically connected to the first conductivity-type semiconductor layer of each of the plurality of LED cells; second bonding electrodes respectively disposed on the first reflective electrode and respectively connected to the first bonding electrodes; second reflective electrodes respectively disposed on the lower surfaces of the plurality of LED cells, and respectively electrically connected to the second conductivity-type semiconductor layer of each of the plurality of LED cells; a common electrode disposed in the peripheral area and connected to the second reflective electrodes; and a pad electrode disposed in the peripheral area and electrically connected to the driving circuit.

According to an embodiment, a display apparatus includes a circuit board including a driving circuit and first bonding electrodes; and a pixel array disposed on the circuit board, and having pixel units each of the pixel units including a plurality of sub-pixels. The pixel array includes a plurality of LED cells arranged to correspond to the plurality of sub-pixels, each of the plurality of LED cells including a first conductivity-type semiconductor layer, an active layer and a second conductivity-type semiconductor layer sequentially stacked on the circuit board; wavelength converters disposed on upper surfaces of the plurality of LED cells; a partition structure disposed on the upper surfaces of the plurality of LED cells, surrounding side surfaces of the wavelength converters, and separating the wavelength converters from each other; a partition reflective layer having a first portion on an upper surface of the partition structure, and a second portion on sidewalls of the partition structure, the first portion having a thickness greater than a thickness of the second portion; second bonding electrodes connected to the first bonding electrodes; a first reflective electrode connected to the first conductivity-type semiconductor layer of each of the plurality of LED cells, and connected to the driving circuit through a portion of the first and second bonding electrodes; and second reflective electrodes connected to the second conductivity-type semiconductor layer of each of the plurality of LED cells, and connected to the driving circuit through other portions of the first and second bonding electrodes.

BRIEF DESCRIPTION OF DRAWINGS

Features will become apparent to those of skill in the art by describing in detail example embodiments with reference to the attached drawings in which.

DETAILED DESCRIPTION

Unless otherwise specified, in this specification, terms such as 'upper', 'upper surface', 'lower', 'lower surface', 'side' and 'side surface' are based on the drawings, and in fact, may be changed depending on the direction in which the element is disposed.

Figure 1:
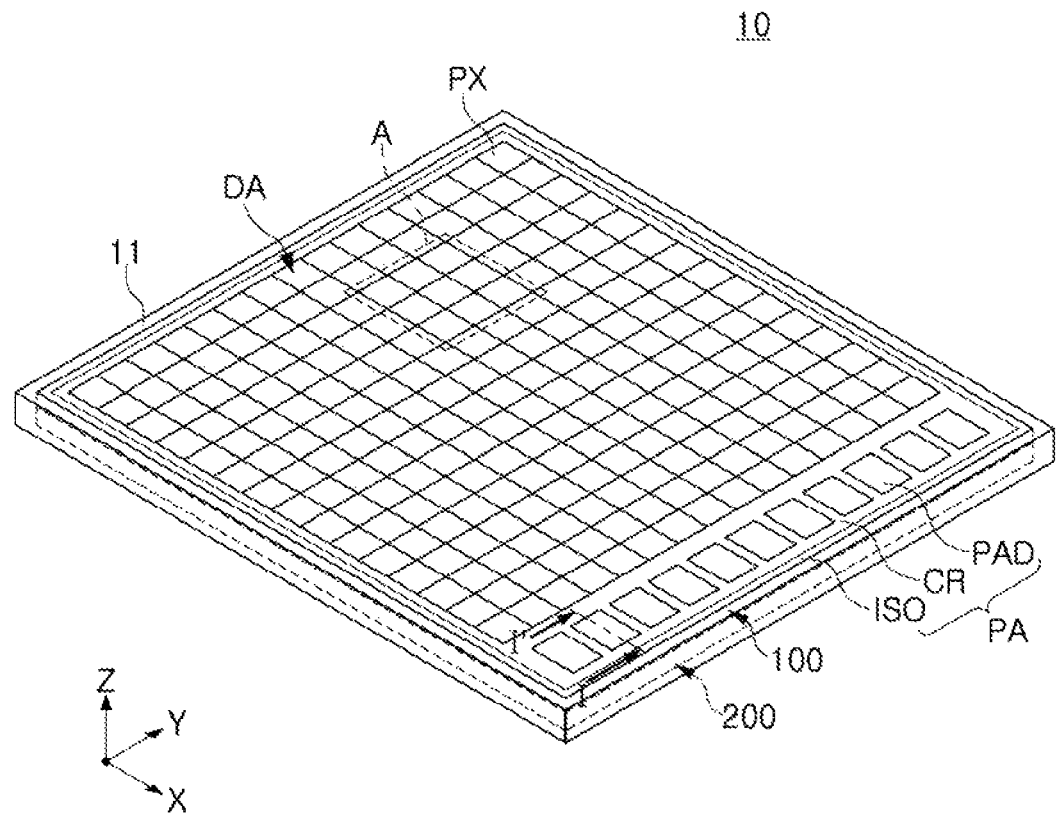
FIG. 1 is a schematic perspective view of a display apparatus according to an example embodiment.
Figure 2:
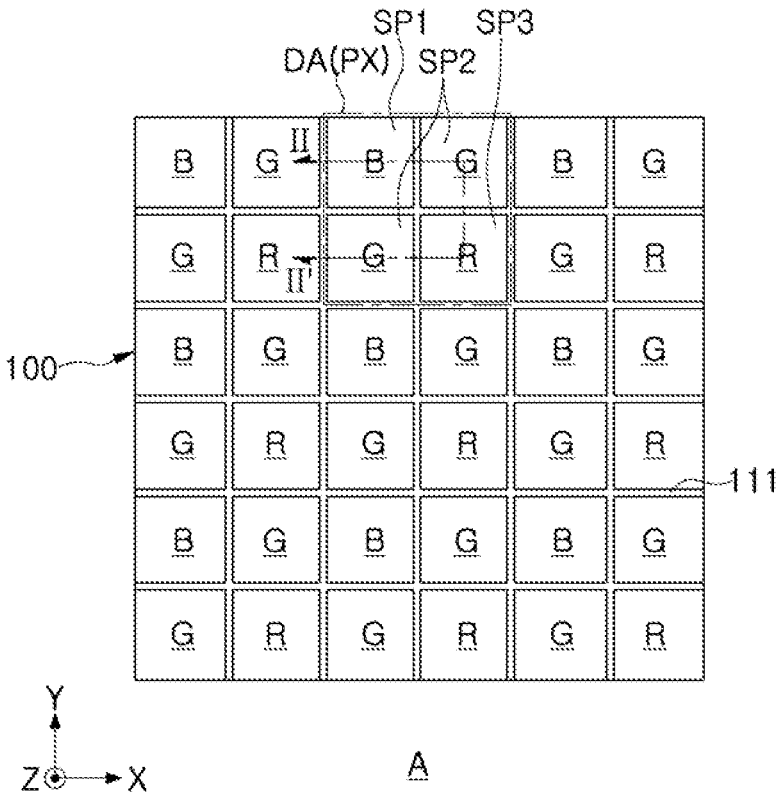
FIG. 2 is a schematic plan view of a display apparatus according to an example embodiment.

FIG. 1 is a schematic perspective view of a display apparatus according to an example embodiment, and FIG. 2 is a schematic plan view of a display apparatus according to an example embodiment.

Referring to FIGS. 1 and 2, a display apparatus 10 according to an example embodiment includes a circuit board 200 including driving circuits, and a pixel array 100 which is disposed on the circuit board 200 and in which a plurality of pixels PX are arranged. The display apparatus 10 may further include a frame 11 surrounding the circuit board 200 and the pixel array 100.

The circuit board 200 may include a driving circuit including thin film transistor (TFT) cells. In an example embodiment, the circuit board 200 may additionally include other driving circuits in addition to the driving circuits for the display apparatus. In an example embodiment, the circuit board 200 includes a flexible board, and the display apparatus 10 may be implemented as a display apparatus having a curved profile.

The pixel array 100 may include a display area DA and a peripheral area PA on at least one side of the display area DA. The display area DA may include an LED module for display. The pixel array 100 may include the display area DA in which a plurality of pixels PX are arranged. The peripheral area PA may include pad areas PAD, a connection region CR connecting the plurality of pixels PX and the pad areas PAD, and an edge region ISO.

Each of the plurality of pixels PX may include first to third sub-pixels SP1, SP2, and SP3 configured to emit light of a specific wavelength, e.g., a specific color to provide a color image. For example, the first to third sub-pixels SP1, SP2, and SP3 may be configured to emit blue (B) light, green (G) light, and red (R) light, respectively. In an example embodiment, in each pixel PX (or pixel unit), the first to third sub-pixels SP1, SP2, and SP3 may be arranged in a Bayer pattern.

Referring to FIG. 2, each pixel PX may include first and third sub-pixels SP1 and SP3 (e.g., B and R) arranged in a first diagonal direction, and two second sub-pixels SP2 (e.g., G) arranged in a second diagonal direction intersecting the first diagonal direction. In the present example embodiment, each pixel PX is illustrated in a form in which the first to third sub-pixels SP1, SP2, and SP3 are arranged in a 2×2 Bayer pattern, but each pixel PX may be configured in a different arrangement such as 3×3 or 4×4. Also, in example embodiments, each pixel PX may include a sub-pixel configured to emit a color different from the illustrated colors R, G, B, e.g., yellow light. In the pixel array 100 of FIG. 1, although the plurality of pixels PX is illustrated in a 15×15 arrangement, the number of columns and columns may be embodied in any suitable number, e.g., 1,024×768. For example, the plurality of pixels PX may have a different arrangement according to a desired resolution.

The pad areas PAD may be disposed on at least one side of the plurality of pixels PX along the edge of the display apparatus 10. The pad areas PAD may be electrically connected to the plurality of pixels PX and driving circuits of the circuit board 200. The pad areas PAD may electrically connect an external device to the display apparatus 10. In an example embodiment, the number of the pad areas PAD may be variously changed, and, e.g., may be determined according to the number of pixels PX, a driving method of the TFT circuit in the circuit board 200, or the like.

The connection region CR may be located between the plurality of pixels PX and the pad areas PAD. A wiring structure electrically connected to the plurality of pixels PX, e.g., a common electrode, may be disposed in the connection region CR. The edge region ISO may be an area along edges of the pixel array 100. The edge region ISO may be a region in which an upper semiconductor layer 111 is not disposed (refer to FIG. 3).

The frame 11 may be disposed around the pixel array 100 to serve as a guide for defining an arrangement space of the pixel array 100. The frame 11 may include, e.g., at least one of a material such as a polymer, a ceramic, a semiconductor or a metal. For example, the frame 11 may include a black matrix. However, the frame 11 may include a white matrix or a structure of another color depending on the purpose of the display apparatus 10. For example, the white matrix may include a reflective material or a scattering material. Although the display apparatus 10 is illustrated as having a rectangular planar structure in FIG. 1, the display apparatus 10 may have a different shape according to example embodiments.

Figure 3:
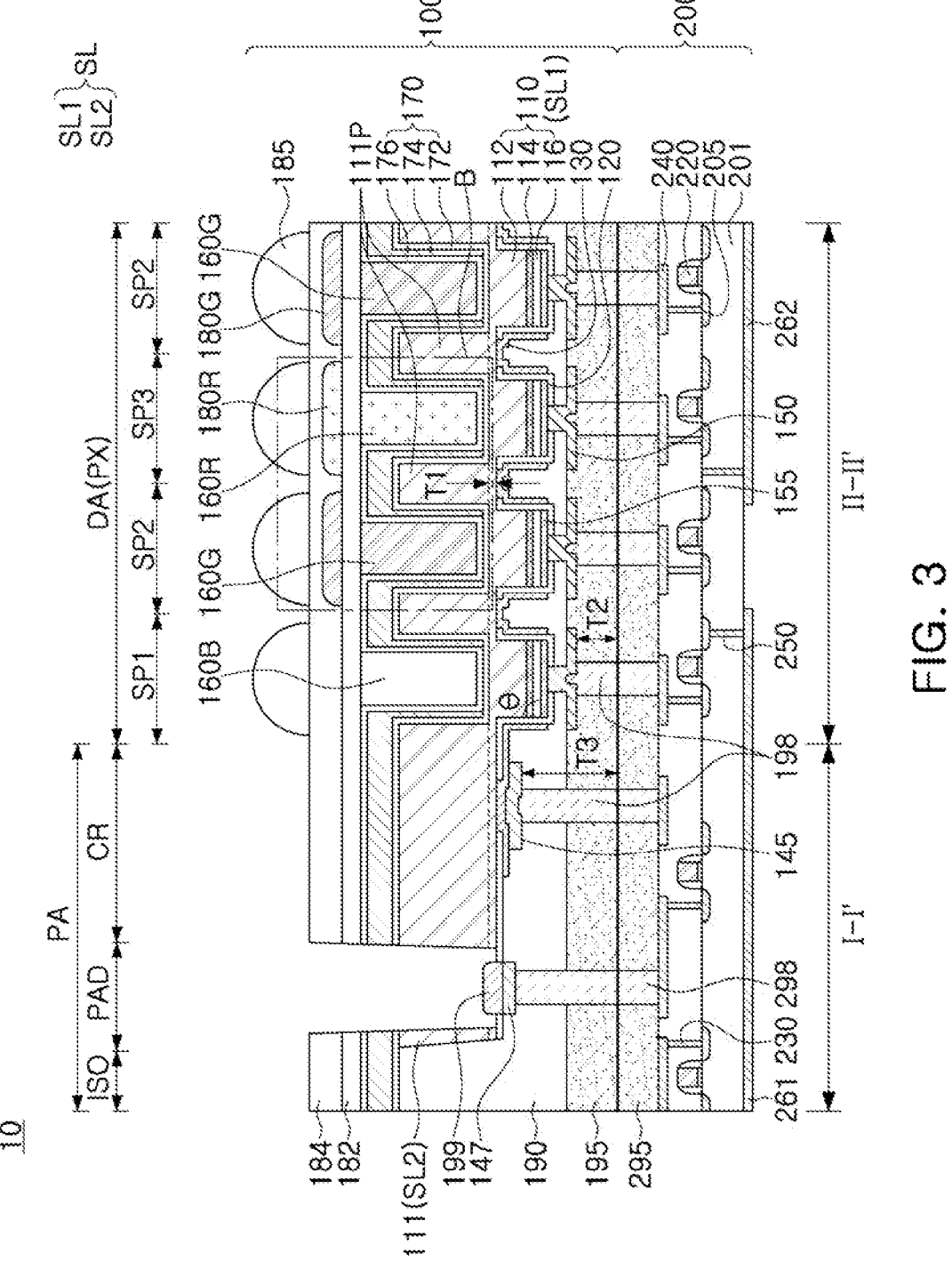
FIG. 3 is a schematic cross-sectional view of a display apparatus according to an example embodiment.

FIG. 3 is a schematic cross-sectional view of a display apparatus according to an example embodiment, wherein a cross-section taken along I-I' in FIG. 1 (peripheral area PA) and a cross-section taken along II-II of FIG. 2 are combined (display area DA).

Referring to FIG. 3, the display apparatus 10 according to the present example embodiment includes the circuit board 200 and the pixel array 100 disposed on the circuit board 200.

The circuit board 200 may include a driving circuit including a semiconductor substrate 201 and driving elements 220 including TFT cells formed on the semiconductor substrate 201, interconnections 230 electrically connected to the driving elements 220, wiring lines 240 on the interconnections 230, and a circuit insulating layer 290 covering the driving circuit. In the present example embodiment, the circuit board 200 may further include a first bonding insulating layer 295 on the circuit insulating layer 290, and first bonding electrodes 298 disposed in the first bonding insulating layer 295 and connected to the wiring lines 140.

The semiconductor substrate 201 may include impurity regions including source/drain regions 205. The semiconductor substrate 201 may include, e.g., a semiconductor such as silicon (Si) or germanium (Ge), or a compound semiconductor such as SiGe, SiC, GaAs, InAs, or InP. The semiconductor substrate 201 may further include through electrodes 250 such as through silicon via (TSV) connected to the driving circuit, and first and second substrate wiring lines 261, 262 connected to the through electrodes 250.

The driving circuit may include a circuit for controlling driving of a pixel, e.g., a sub-pixel. The source region 205 of the TFT cells may be electrically connected to one electrode of LED cells 110 through the interconnections 230, the wiring line 240, and the first bonding electrode 298. For example, the drain region 205 of the TFT cells may be connected to the first wiring line 261 through the through electrode 250, and the first wiring line 261 may be connected to a data line. The gate electrodes of the TFT cells may be connected to the second wiring line 262 through the through electrode 250, and the second wiring line 262 may be connected to the gate line. This circuit configuration and operation will be described in more detail with reference to FIG. 5 below.

Upper surfaces of the first bonding electrodes 298 and upper surfaces of the first bonding insulating layer 295 may form the upper surface of the circuit board 200. The first bonding electrodes 298 may be bonded to the second bonding electrodes 198 of the pixel array 100 to provide an electrical connection path. The first bonding electrodes 298 may include a conductive material, e.g., copper (Cu). The first bonding insulating layer 295 may be bonded to a second bonding insulating layer 195 of the pixel array 100. For example, the first bonding insulating layer 295 may include at least one of SiO, SiN, SiCN, SiOC, SiON, and SiOCN.

The pixel array 100 may include a semiconductor stack SL. In the present example embodiment, the semiconductor stack SL may be understood as an epitaxial layer continuously grown on one growth substrate. The semiconductor stack SL may include a first semiconductor region SL1 facing the circuit board 200 and divided into a plurality of LED cells 110, and a second semiconductor region SL2 (also referred to as a "first upper semiconductor layer 111") positioned on the first semiconductor region SL1. In FIG. 3, a dotted line in the horizontal direction of the semiconductor stack SL may be understood as a boundary dividing the first and second semiconductor regions SL1 and SL2.

As described above, the pixel array 100 includes a display area in which a plurality of pixels PX are arranged, and each of the plurality of pixels PX may include first to third sub-pixels SP1, SP2, and SP3 arranged according to a predetermined pattern (e.g., a Bayer pattern). The plurality of LED cells 110 may respectively be a micro LED, and may be formed to correspond to the first to third sub-pixels SP1, SP2, and SP3, respectively The LED cells 110 may be arranged in a plurality of columns and a plurality of rows in a plan view (see FIG. 2).

In an example embodiment, each of the LED cells 110 may be configured to emit blue light, e.g., light having a wavelength between 435 nm and 460 nm.

In the present example embodiment, each of the LED cells 110 may include a first conductivity-type semiconductor layer 112, an active layer 114, and a second conductivity-type semiconductor layer 116 sequentially stacked on the lower surface of the upper semiconductor layer 111. The active layer 114 and the second conductivity-type semiconductor layer 116 may be separated in units of the LED cells 110. Each of the LED cells 110 may be defined by side surfaces of active layers 114 and second conductivity-type semiconductor layers 116.

On the other hand, the first conductivity-type semiconductor layer 112 may be provided as a single layer to be shared by the plurality of LED cells 110, and, referring to FIG. 3, may be configured such that a portion (e.g., a lower region) of the first conductivity-type semiconductor layer 112 is separated, while the remaining region (e.g., an upper region) of the first conductivity-type semiconductor layer 112 is not separated and is connected between the plurality of LED cells (110) to each other.

The LED cells 110 constituting the first to third sub-pixels SP1, SP2, and SP3 may be connected by the upper region of the first conductivity-type semiconductor layer 112. Similarly, the LED cells 110 of the other pixels PX may be connected to each other by the upper region of the first conductivity-type semiconductor layer 112. A thickness T1 of the upper region may be, e.g., about 0.1 μm or more. In an example embodiment, the thickness T1 of the upper region may range from about 0.1 μm to about 1.0 μm.

The upper semiconductor layer 111 corresponding to the second semiconductor region SL2 may be disposed to extend from the display area DA to the connection region CR and the pad areas PAD, e.g., one area of the peripheral area PA. The non-isolated upper region of the first conductivity-type semiconductor layer 112 may also extend along the lower surface of the upper semiconductor layer 111.

In the present example embodiment, the first conductivity-type semiconductor layer 112, the active layer 114, and the second conductivity-type semiconductor layer 116 may be nitride epitaxial layers. The first conductivity-type semiconductor layer 112 and the second conductivity-type semiconductor layer 116 may be a nitride semiconductor layer having the composition of n-type and p-type $In_xAl_yGa_{1-x-y}N$ ($0 \leq x < 1$, $0 \leq y < 1$, $0 \leq x+y < 1$), respectively. For example, the first conductivity-type semiconductor layer 112 may be an n-type gallium nitride (n-GaN) layer doped with silicon (Si), germanium (Ge), or carbon (C), and the second conductivity-type semiconductor layer 116 may be a p-type gallium nitride (p-GaN) layer doped with magnesium (Mg) or zinc (Zn). However, in some embodiments, the first conductivity-type semiconductor layer 112 and the second conductivity-type semiconductor layer 116 may be formed of an aluminum indium gallium phosphide (AlInGaP) or aluminum indium gallium arsenide (AlInGaAs)-based semiconductor layer, in addition to the nitride semiconductor. Although each of the first conductivity-type semiconductor layer 112 and the second conductivity-type semiconductor layer 116 may be formed of a single layer, each of the first conductivity-type semiconductor layer 112 and the second conductivity-type semiconductor layer 116 may also include a plurality of layers having different properties such as doping concentration and composition.

The active layer 114 may emit light having a predetermined energy by recombination of electrons and holes. The active layer 114 may have a single (SQW) or multiple quantum well (MQW) structure in which quantum barrier layers and quantum well layers are alternately disposed. For example, the quantum well layer and the quantum barrier layer may be $In_xAl_yGa_{1-x-y}N$ ($0 \leq x \leq 1$, $0 \leq y \leq 1$, $0 \leq x+y \leq 1$) layers having different compositions. For example, the quantum well layer may be an $In_xGa_{1-x}N$ ($0<x\leq1$) layer, and the quantum barrier layer may be a GaN layer or an AlGaN layer.

The upper semiconductor layer 111 may include a nitride epitaxial layer that is the same as the nitride semiconductor epitaxial layers constituting the LED cells 110. As described above, the upper semiconductor layer 111 may include a nitride epitaxial layer continuously grown with the first conductivity-type semiconductor layer 112, the active layer 114, and the second conductivity-type semiconductor layer 116. In an example embodiment, the upper semiconductor layer 111 may include an undoped nitride layer or a stack of an undoped nitride layer and a first conductivity-type (n-type) nitride layer.

Each of the LED cells 110 may have an angle θ between the lower surface and the side surfaces, a right angle or an angle similar to a right angle. For example, the angle θ may range from about 85 degrees to about 95 degrees. The LED cells 110 may be obtained by sequentially performing a dry etching process and a wet etching process (see FIG. 10B).

A partition structure 111P may be formed in the display area DA of the second semiconductor region SL2, e.g., the upper semiconductor layer 111. The partition structure 111P may be configured to define a plurality of sub-pixel spaces (refer to OP1, OP2, and OP3 of FIG. 11B) in regions corresponding to each of the plurality of LED cells 110. Referring to FIG. 3, each of the plurality of sub-pixel spaces is positioned on the upper surface of each of the LED cells 110 to correspond to the plurality of LED cells 110. Each of the sub-pixel spaces may have vertical or slanted sides along the Z direction. For example, in an example embodiment, each of the sub-pixel spaces may have slanted sides such that the width at the top is narrower than the width at the bottom. The partition structure 111P may be disposed on the LED cells 110.

Wavelength converters 160R, 160G, and 160B may be provided in the sub-pixels SP1, SP2, and SP3 defined by the partition structure 111P.

The partition structure 111P may include the upper semiconductor layer 111 having light transmittance, and a partition reflective layer 170 may be introduced between the sub-pixels SP1, SP2, and SP3 so as not to receive optical interference. The partition reflective layer 170 employed in the present example embodiment may be formed on the upper surface and sidewalls of the partition structure 111P.

Wavelength converters 160R, 160G, and 160B may be formed in each of the sub-pixel spaces in which the partition reflective layer 170 is formed. The wavelength converters 160R, 160G, and 160B may be disposed to correspond to the LED cells 110. The wavelength converters 160R, 160G, and 160B may include a wavelength conversion material for converting light emitted from the LED cells 110 to generate final light of a desired color from each of the sub-pixels SP1, SP2, and SP3. The wavelength converting material may include phosphors and/or quantum dots. Each of the wavelength converters 160R, 160G, and 160B may be obtained by filling each sub-pixel space with a liquid binder resin in which a wavelength conversion material is dispersed, and then curing.

As in the present example embodiment, when the active layers 114 of the plurality of LED cells 110 are each configured to emit blue light, the first wavelength converter 160R may be configured to convert blue light into red light, and the second wavelength converter 160G may be configured to convert blue light into green light. However, the third wavelength converter 160B applied to the sub-pixel space for the blue sub-pixel may be replaced with a transparent material such as a transparent resin.

In another example embodiment, each of the active layers 114 of the plurality of LED cells 110 may be configured to emit ultraviolet light, and the first wavelength converter 160R may be configured to convert the ultraviolet light into red light, the second wavelength converter 160G may be configured to convert the ultraviolet light into green light, and the third wavelength converter 160B may be configured to convert the ultraviolet light into blue light.

The partition reflective layer 170 employed in the present example embodiment may include a first partition insulating film 172, a reflective metal film 174, and a second partition insulating film 176 sequentially stacked. The first partition insulating film 172 and the second partition insulating film 176 may include an insulating material, e.g., at least one of $SiO_2$, SiN, SiCN, SiOC, SiON, and SiOCN. The partition metal layer 174 may include a reflective metal, e.g., at least one of silver (Ag), nickel (Ni), and aluminum (Al). In the present example embodiment, the partition metal layer 174 is formed on inner sidewalls of the plurality of sub-pixel spaces, but is not formed on the bottom surface, e.g., the lower surface of the wavelength converters 160R, 160G, and 160B. Through this arrangement, the light emitted from each of the LED cells 110 from the bottom surface of the plurality of sub-pixel spaces may be provided to each of the wavelength converters 160R, 160G, and 160B.

Figure 4:
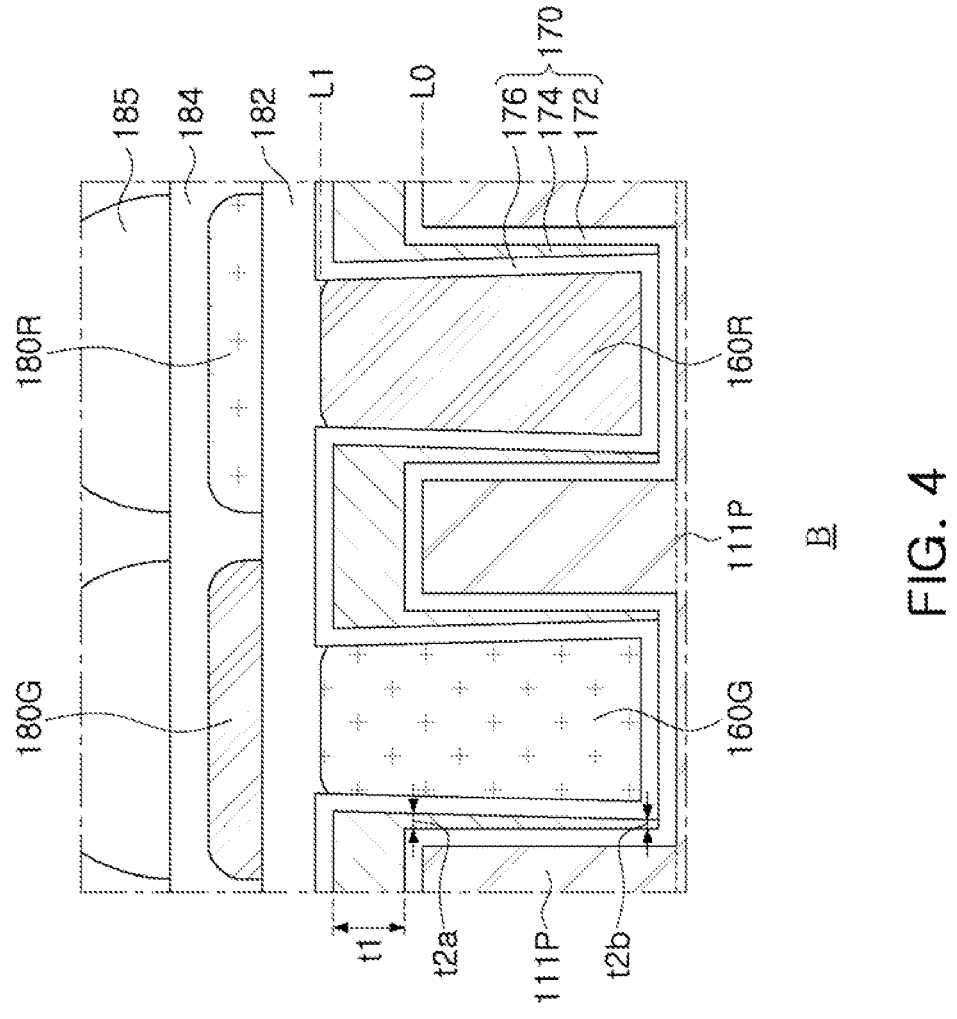
FIG. 4 is a partially enlarged view illustrating an enlarged portion of a display apparatus according to an example embodiment.

Referring to FIG. 4, the partition reflective layer 170 employed in the present example embodiment may be formed such that the thickness of the first portion positioned on the upper surface of the partition structure 111P is greater than the thickness of the second portion positioned on the sidewalls of the partition structure 111P. By forming the partition reflective layer 170 such that the first portion located on the upper surface of the partition structure 111P has a greater thickness than the thickness of the second portion located on the inner sidewall, a sufficient amount of wavelength converting material may be introduced in a sub-pixel space having a relatively low aspect ratio.

Referring to FIG. 4, the upper surfaces of the wavelength converters 160R and 160G filled in the sub-pixel space may be provided at a level L1 higher than the upper surface level L0 of the partition structure.

In an example embodiment, upper surfaces of the wavelength converters 160R and 160G may be formed to be lower than a level of the upper surface of the partition reflective layer 170, e.g., the upper surface of the second partition insulating film 176. Due to the increased thickness of the first portion of the partition reflective layer 170, since the wavelength converters 160R and 160G of sufficient thickness may be formed, and to prevent overflow into other sub-pixel spaces, the wavelength converters 160R and 160G may be stably formed such that the upper surface level thereof is slightly lower than the upper surface level of the second partition insulating film 176. For example, the upper surface level of the wavelength converters 160R and 160G may be positioned to overlap the first portion of the thick reflective metal film 174 in the horizontal direction.

With the trend for display miniaturization and high resolution, as the width of sub-pixels becomes narrower and the sub-pixel space defined by the partition structure 111P is narrowed, it may be difficult to provide a sufficient amount of the wavelength conversion material. Also, if the aspect ratio of the sub-pixel space is excessively increased, the partition reflective layer 170 to be formed on the inner sidewalls and upper surface of the partition structure 111P may be too low in side step coverage, and the partition reflective layer (e.g., the reflective metal film 174) may not be formed on the lower end of the inner sidewall.

With respect to the above, the present example embodiment provides for an increase of the actual height of the partition by adjusting the thickness of the partition reflective layer 170. Thus, a sufficient space for accommodating the wavelength conversion material may be stably secured without excessively increasing the aspect ratio of the sub-pixel space.

In an example embodiment, the first and second partition insulating films 172 and 176 may be formed to have substantially the same thickness on the upper surface and sidewalls of the partition structure 111P, respectively. For example, the first and second partition insulating films 172 and 176 may be formed using an atomic layer deposition (ALD) method.

Accordingly, the change in the thickness of the partition reflective layer 170 may substantially depend on the change in the thickness of the reflective metal film 174.

The thickness of the reflective metal film 174 may be implemented by adjusting the process conditions of the reflective metal film 174. For example, the reflective metal film 174 may be formed using sputtering or a CVD process.

In the present example embodiment, the reflective metal film 174 includes a first portion positioned on the upper surface of the partition structure 111P and a second portion positioned on the sidewall of the partition structure 111P, and a thickness t1 of the first portion may be greater than the thickness of the second portion. In this case, the second portion may be formed such that a bottom thickness t2*b* of the lower end is thinner than a top thickness t2*a* of the upper end. The thickness t1 of the first portion may be defined using the thickness of any point of the second portion. In an example embodiment, the thickness t1 of the first portion may be two or more times, e.g., three or more times, that of the top thickness t2*a* of the second portion. In an example embodiment, the thickness t1 of the first portion may be 10 or more times, e.g., 12 or more times, that of the thickness t2*b* of the bottom part of the second portion.

By way of example, the thickness t1 of the first portion of the reflective metal film 174 may be in the range of 0.3 μm to 1 μm, the top thickness t2*a* of the second portion of the reflective metal film 174 may be in a range of 50 nm to 200 nm, and the bottom thickness t2*b* of the second portion of the reflective metal film 174 may be in a range of 20 nm to 100 nm.

Referring again to FIG. 3, a passivation layer 120 may cover some and side surfaces of lower surfaces of the LED cells 110, and may extend to the peripheral area PA. The passivation layer 120 may be disposed to cover the lower surface of the first conductivity-type semiconductor layer 112 in the connection region CR and the pad areas PAD, e.g., the peripheral area PA. The passivation layer 120 may include an insulating material, e.g., at least one of SiO2, SiN, SiCN, SiOC, SiON, and SiOCN.

The first electrode 130 may be connected to the first conductivity-type semiconductor layer 112. For example, the first electrode 130 may be disposed to be electrically insulated from the LED cell 110 by the passivation layer 120 on the side surfaces of the LED cell 110. The first electrode 130 may extend to the outside of the LED cell 110, e.g., to the peripheral area PA. The first electrode 130 extending to the peripheral area PA may be connected in areas between the adjacent LED cells 110 to be disposed as a single layer. The first electrode 130 may have a structure extending from one side of one LED cell 110 to the opposite side of the adjacent LED cell 110. The first electrode 130 may include a reflective metal material. For example, the first electrode 130 may include at least one of silver (Ag), nickel (Ni), aluminum (Al), chromium (Cr), rhodium (Rh), iridium (Ir), palladium (Pd), ruthenium (Ru), magnesium (Mg), zinc (Zn), and/or at least one of platinum (Pt) and gold (Au). In an example embodiment, the first electrode 130 may include a single-layer or multi-layer structure of a conductive material.

The first electrode 130 provided as a reflective electrode (also referred to as a "first reflective electrode") may have an inverted U-shape between adjacent LED cells 110. The first electrode 130 may have a grid or mesh shape including lines extending in the X-direction and the Y-direction along regions between the pixels PX and the first to third sub-pixels SP1, SP2, and SP3. Ends of the first electrode 130 may be connected to the common electrode 145. Referring to FIG. 3, the outermost portions of the first electrode 130 may be connected to the common electrode 145.

In an example embodiment, the first electrode 130 may extend to the peripheral area PA located at the outermost portion of the pixels PX, e.g., the connection region CR, be connected to the first conductivity-type semiconductor layer 112, and be physically and electrically connected to the common electrode 145.

The first electrode 130 may be electrically connected to the first conductivity-type semiconductor layer 112 in a region between the LED cells 110. For example, the region in which the first electrode 130 contacts the first conductivity-type semiconductor layer 112 may overlap the partition structure 111P of the upper semiconductor layer 111 in the Z direction. For example, the first electrode 130 may be disposed so as not to overlap the LED cells 110, e.g., the active layer 114 and the second conductivity-type semiconductor layer 116 in the Z direction. In an example embodiment, the first electrode 130 may be disposed so as not to overlap the wavelength converters 160R, 160G, and 160B along the Z direction.

The contact layers 155 and the second electrodes 150 may be sequentially disposed on lower surfaces of the second conductivity-type semiconductor layers 116 to be connected to the second conductivity-type semiconductor layers 116. The contact layer 155 may be disposed to cover the entire lower surface of the second conductivity-type semiconductor layer 116. The second electrode 150 may include a reflective metal material similarly to the first electrode 130. For example, the second electrode 150 may include at least one of silver (Ag), nickel (Ni), aluminum (Al), chromium (Cr), rhodium (Rh), iridium (Ir), palladium (Pd), ruthenium (Ru), magnesium (Mg), zinc (Zn), platinum (Pt) and gold (Au). In an example embodiment, the second electrode 150 may include a single-layer or multi-layer structure of a conductive material.

The second electrode 150 as a reflective electrode (also referred to as a "second reflective electrode") may be disposed to overlap the LED cells 110 in the Z direction under each of the LED cells 110. The second electrode 150 may be disposed under the contact layer 155 to be connected to the contact layer 155. The length of the second electrode 150 along the X direction may be the same as or similar to the length of the LED cells 110. In an example embodiment, the second electrodes 150 may be omitted, and in this case, the contact layers 155 may be directly connected to the second bonding electrodes 198 below.

The contact layers 155 and the second electrodes 150 may include, e.g., a highly reflective metal, e.g., at least one of silver (Ag), nickel (Ni), aluminum (Al), chromium (Cr), rhodium (Rh), iridium (Ir), palladium (Pd), ruthenium (Ru), magnesium (Mg), zinc (Zn), platinum (Pt), and gold (Au).

The pixel array 100 employed in the present example embodiment may further include an encapsulation layer 182 and a planarization layer 184 on the wavelength converters 160R, 160G, and 160B, a first pad electrode 147, a wiring insulating layer 190, the second bonding insulating layer 195, the second bonding electrodes 198, and a second pad electrode 199.

In the peripheral area PA, the upper semiconductor layer 111 may have a continuous layer structure rather than the partition structure 111P, and the common electrode 145 may extend on the upper semiconductor layer 111 area of the peripheral area PA. Also, referring to FIG. 3, a region (e.g., a through hole) in which a portion of the upper semiconductor layer 111 is removed may be formed in the peripheral area PA, e.g., in the pad areas PAD.

As described above, the upper semiconductor layer 111 may include a region integrated with the first conductivity-type semiconductor layer 112 of the LED cells 110 or a continuous region. The upper semiconductor layer 111 may be a layer grown during a growth process of the LED cells 110. For example, the upper semiconductor layer 111 may include the same material as the first conductivity-type semiconductor layer 112 in at least a region adjacent to the first conductivity-type semiconductor layer 112. In FIG. 3, the first conductivity-type semiconductor layer 112 (the first semiconductor region SL1) and the upper semiconductor layer 111 (the second semiconductor region SL2) are discriminated by a dotted line, but the two structures may be regions that are continuously grown, and the interface may not be actually observed.

The encapsulation layer 182 may be disposed to cover upper surfaces of the wavelength converters 160R, 160G, and 160B. The encapsulation layer 182 may function as a protective layer that prevents deterioration of the wavelength converters 160R, 160G, and 160B. In an example embodiment, the encapsulation layer 182 may be omitted.

The color filters 180R and 180G may be disposed on the wavelength converters 160R, 160G, and 160B in the second and third sub-pixels SP2 and SP3. The color filters 180R and 180G may increase the color purity of light emitted through the first wavelength converter 160R and the second wavelength converter 160G. In an example embodiment, a color filter may be further disposed on the third wavelength converter 160B.

The planarization layer 184 may be disposed to cover upper surfaces of the color filters 180R and 180G and the encapsulation layer 182. The planarization layer 184 may be a transparent layer.

Microlenses 185 may be disposed on the planarization layer 184 to correspond to the wavelength converters 160R, 160G, and 160B, respectively. The microlenses 185 may collect light incident from the wavelength converters 160R, 160G, and 160B. The microlenses 185 may have, e.g., a diameter greater than the width of the LED cells 110 in the X and Y directions. The microlenses 185 may be formed of, e.g., a transparent photoresist material or a transparent thermosetting resin film.

The common electrode 145 and the first pad electrode 147 may be disposed in the connection region CR and the pad areas PAD, respectively. The common electrode 145 may be disposed on a lower surface of the first reflective electrode 130 extending from the pixel PX to connect the first reflective electrode 130 to the second bonding electrode 198. The common electrode 145 may form a common electrode structure together with the first reflective electrode 130. The common electrode 145 may be disposed in a square ring shape or a ring shape to surround the entire pixels PX in a plan view, and may be connected to ends of the first reflective electrode 130. The first pad electrode 147 may be disposed under the second pad electrode 199 in the pad areas PAD to connect the second pad electrode 199 and the second bonding electrode 198. The common electrode 145 and the first pad electrode 147 may include a conductive material, e.g., at least one of silver (Ag), nickel (Ni), aluminum (Al), chromium (Cr), rhodium (Rh), iridium (Ir), palladium (Pd), ruthenium (Ru), magnesium (Mg), zinc (Zn), platinum (Pt), and gold (Au).

The second pad electrode 199 may be disposed on the first pad electrode 147 in the pad areas PAD. The second pad electrode 199 may be disposed such that at least an upper surface thereof is exposed upward through an opening penetrating the upper semiconductor layer 111 and the first conductivity-type semiconductor layer 112. Using, e.g., wire bonding or anisotropic conductive film (ACF) bonding, the second pad electrode 199 may be connected to an external device, e.g., an external circuit (external IC) capable of applying an electrical signal to the circuit board 200. The second pad electrode 199 may electrically connect the driving circuits of the circuit board 200 and the external device. The second pad electrode 199 may include a metal, e.g., gold (Au), silver (Ag), nickel (Ni), or the like.

The second bonding electrodes 198 may connect the second reflective electrodes 150, the common electrode 145, and the first pad electrode 147 to the first bonding electrodes 298 of the circuit board 200. The second bonding electrodes 198 may be connected to the second electrodes 150, below the second electrodes 150, in the pixel PX, be connected to the common electrode 145 in the connection region CR, and be connected to the first pad electrode 147 in the pad areas PAD.

Referring to FIG. 3, of the second bonding electrodes 198, the second bonding electrodes 198 connected to the second electrodes 150 may have a second thickness T2 or a second height, and the second bonding electrodes 198 connected to the common electrode 145 and the first pad electrode 147 may have a third thickness T3 or a third height, which may be greater than the second thickness T2. Bonding electrodes respectively positioned on the common electrode 145 and the first pad electrode 147 among the second bonding electrodes 198 may be referred to as "third bonding electrode" and "fourth bonding electrode", respectively. The first electrode 130 may be connected to the second bonding electrodes 198 through the common electrode 145, and the second electrodes 150 may be directly connected to the second bonding electrodes 198.

The second bonding electrodes 198 may be disposed to penetrate the wiring insulating layer 190 and the second bonding insulating layer 195. The second bonding electrodes 198 may have a columnar shape, such as a column. In an example embodiment, the second bonding electrodes 198 may have sidewalls inclined such that the size of the upper surface is smaller than the size of the bottom surface. The second bonding electrodes 198 may include, e.g., copper (Cu). The second bonding electrodes 198 may further include a barrier metal layer, e.g., a tantalum (Ta) layer and/or a tantalum nitride (TaN) layer on upper and side surfaces.

The wiring insulating layer 190 may be disposed under the LED cells 110 and the upper semiconductor layer 111 together with the second bonding insulating layer 195. The wiring insulating layer 190 may include silicon oxide or a silicon oxide-based insulating material, e.g., TetraEthyl Ortho Silicate (TEOS), Undoped Silicate Glass (USG), Phosphosilicate Glass (PSG), Borosilicate Glass (BSG), BoroPhosphoSilicate Glass (BPSG), Fluoride Silicate Glass (FSG), Spin On Glass (SOG), TOSZ (Tonen SilaZene), or combinations thereof.

Lower surfaces of the second bonding insulating layer 195 may be disposed to form a lower surface of the pixel array 100 together with lower surfaces of the second bonding electrodes 198. The second bonding insulating layer 195 may form a dielectric-dielectric bond with the first bonding insulating layer 295. The circuit board 200 and the pixel array 100 may be bonded by bonding of the first bonding electrodes 298 and the second bonding electrodes 198 and bonding of the first bonding insulating layer 295 and the second bonding insulating layer 195. The bonding of the first bonding electrodes 298 and the second bonding electrodes 198 may be, e.g., copper (Cu)-copper (Cu) bonding, and the bonding of the first bonding insulating layer 295 and the second bonding insulating layer 195 may be, e.g., a dielectric-dielectric bond such as a SiCN—SiCN bonding. The circuit board 200 and the pixel array 100 may be bonded by hybrid bonding including copper (Cu)-copper (Cu) bonding and dielectric-dielectric bonding, and be bonded without a separate adhesive layer.

The display apparatus 10 according to the present example embodiment may implement a miniaturized, high-resolution device by optimizing the arrangement of the electrode structure including the first electrode 130 and bonding the circuit board 200 and the pixel array 100 using hybrid bonding.

Figure 5:
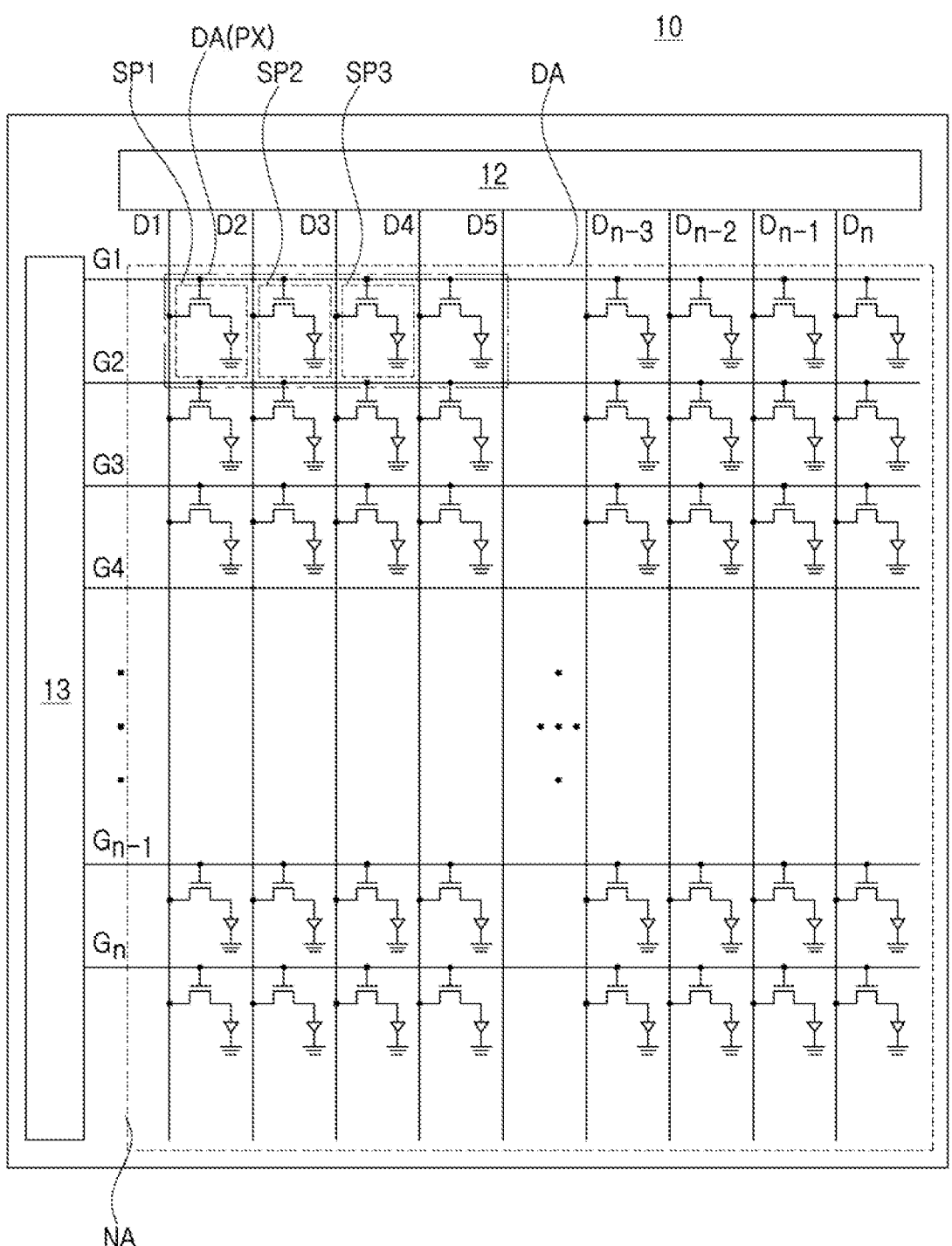
FIG. 5 is a driving circuit implemented in a display apparatus according to an example embodiment.

FIG. 5 is a driving circuit implemented in a display apparatus according to an example embodiment.

Referring to FIG. 5, a circuit diagram of the display apparatus 10 in which n×n sub-pixels are arranged is illustrated. The first to third sub-pixels SP1, SP2, and SP3 may receive a data signal through the data lines D1-Dn, which are paths in a vertical direction, e.g., a column direction, respectively. The first to third sub-pixels SP1, SP2, and SP3 may receive a control signal, e.g., a gate signal, through the gate lines G1-Gn serving as a horizontal direction, e.g., a row direction path.

The plurality of pixels PX including the first to third sub-pixels SP1, SP2, and SP3 provide a display area DA, and the display area DA is provided as a display area for a user as an active area. The non-active area NA (or the peripheral area PA) may be formed along one or more edges of the display area DA. The non-active area NA may extend along the periphery of the panel of the display apparatus 10.

The first and second driver circuits 12 and 13 may be employed to control operations of the pixels PX, e.g., the first to third sub-pixels SP1, SP2, and SP3. Some or all of the first and second driver circuits 12 and 13 may be implemented on the circuit board 200. The first and second driver circuits 12, 13 may be formed of an integrated circuit, thin film transistor panel circuit, or other suitable circuit, and may be disposed in the non-active area NA of the display apparatus 10. The first and second driver circuits 12 and 13 may include a microprocessor, a memory such as storage, a processing circuit, and a communication circuit.

To display an image by means of pixels PX, the first driver circuit 12 may supply image data to the data lines D1-Dn, and send a clock signal and other control signals to the second driver circuit 13 which is a gate driver circuit. The second driver circuit 13 may be implemented using an integrated circuit and/or a thin film transistor circuit. Through the gate lines G1-Gn of the display apparatus 10, a gate signal for controlling the first to third sub-pixels SP1, SP2, and SP3 arranged in the row direction may be transmitted.

Figure 6:
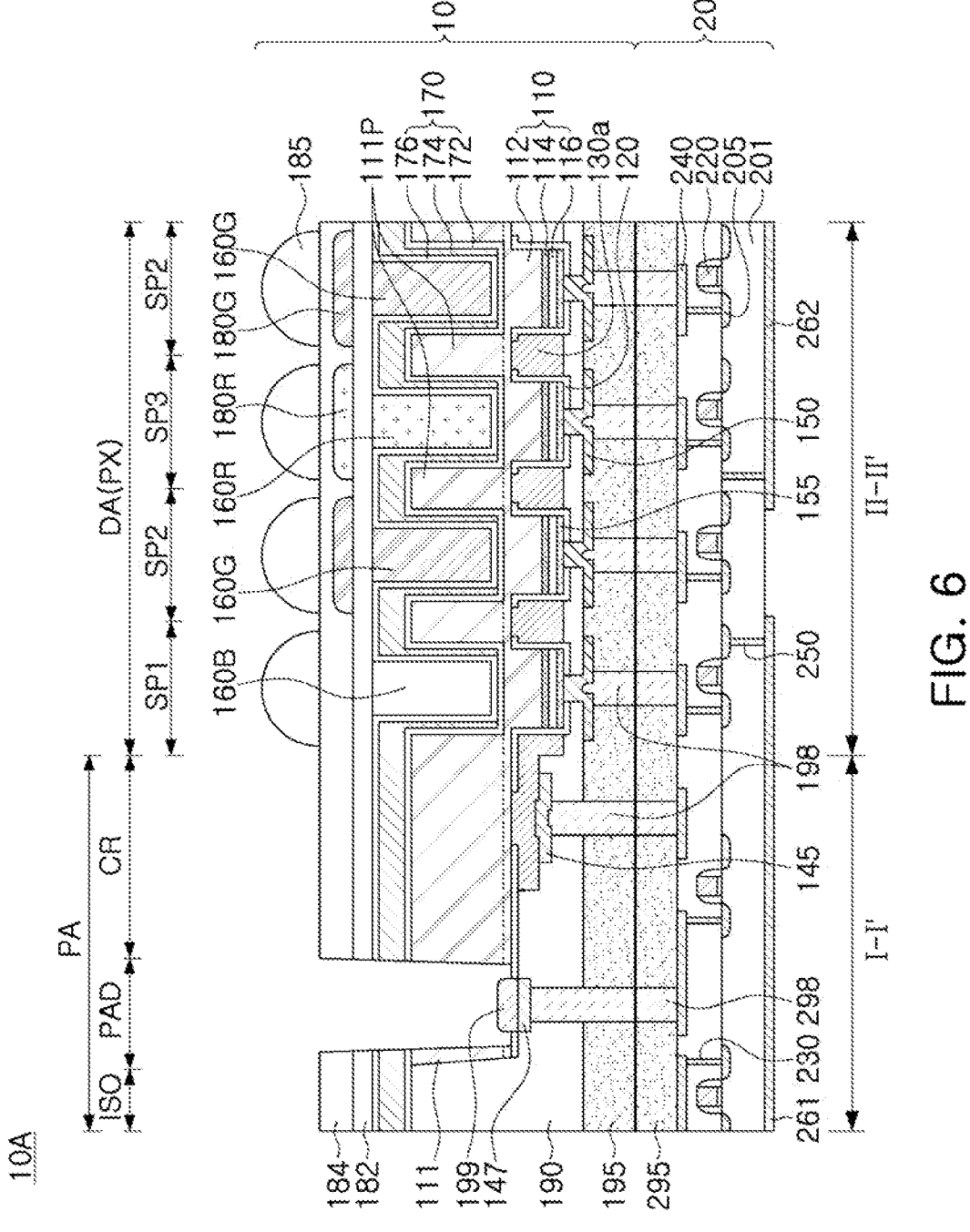
FIG. 6 is a schematic cross-sectional view of a display apparatus according to an example embodiment.

FIG. 6 is a schematic cross-sectional view of a display apparatus according to an example embodiment, and may be understood as a cross-section corresponding to the cross-section corresponding to FIG. 3.

Referring to FIG. 6, a display apparatus 10A according to the present example embodiment may be understood as being similar to the display apparatus 10 illustrated in FIGS. 3 and 4, except that the first reflective electrode 130a has a different structure. In addition, the components of the present example embodiment may be understood with reference to descriptions of the same or similar components of the display apparatus 10 illustrated in FIGS. 3 and 4 unless otherwise specified.

In the pixel array 100 employed in the present example embodiment, the first reflective electrode 130a may be disposed to fill between the passivation layers 120 between the LED cells 110. For example, the first reflective electrode 130a is not conformally disposed with a substantially uniform thickness (see 130 of FIG. 3), but may be formed to be relatively thick to fill the space between the LED cells 110. Even in this case, the first reflective electrode 130a may be disposed in the form of lines extending along the boundaries between the LED cells 110, and may have a grid or mesh shape. As such, the relative thickness and partial shape of the first reflective electrode 130a may be variously changed.

Figure 7A:
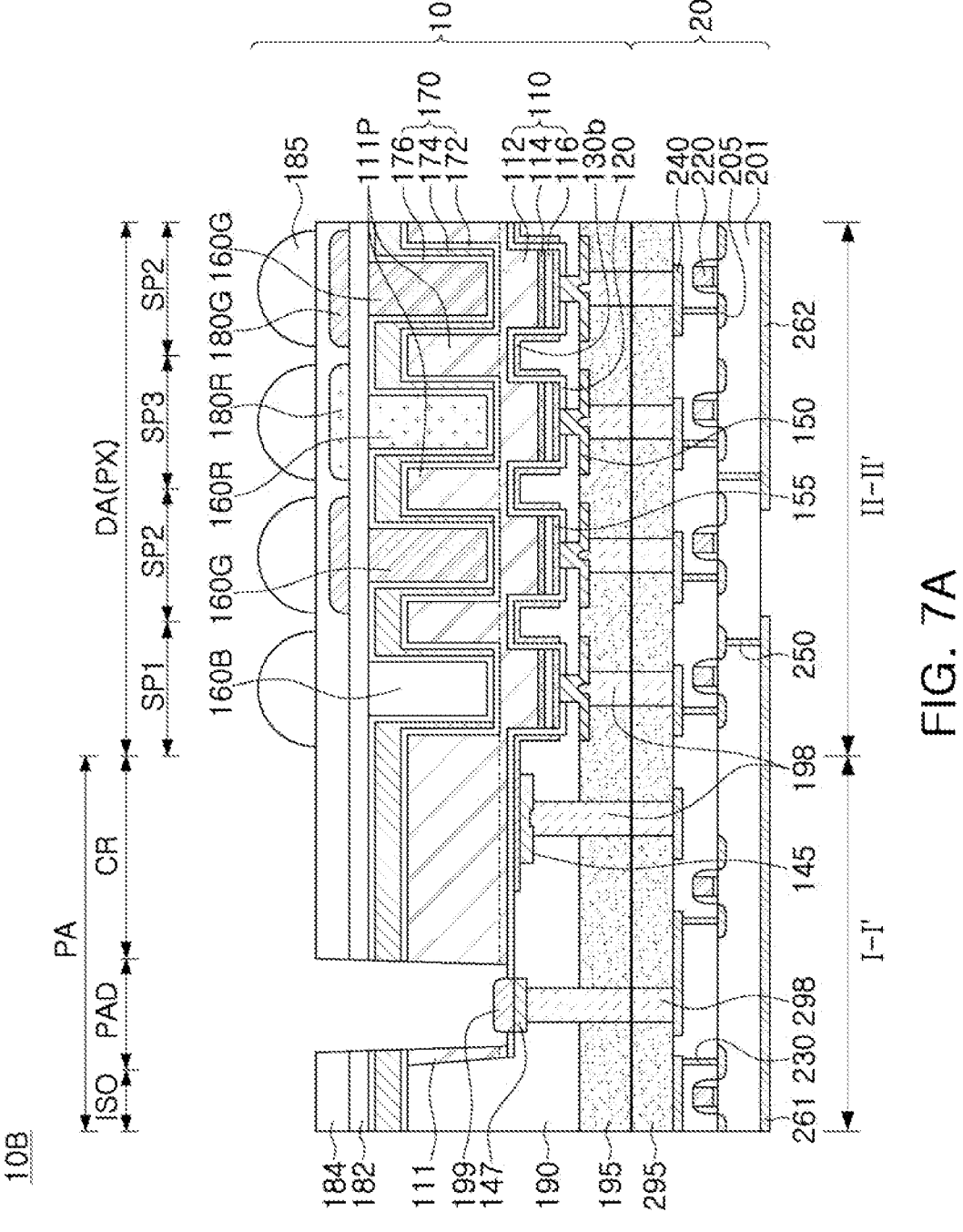
FIGS. 7A to 7C are schematic cross-sectional views and a plan view of a display apparatus according to an example embodiment.
Figure 7B:
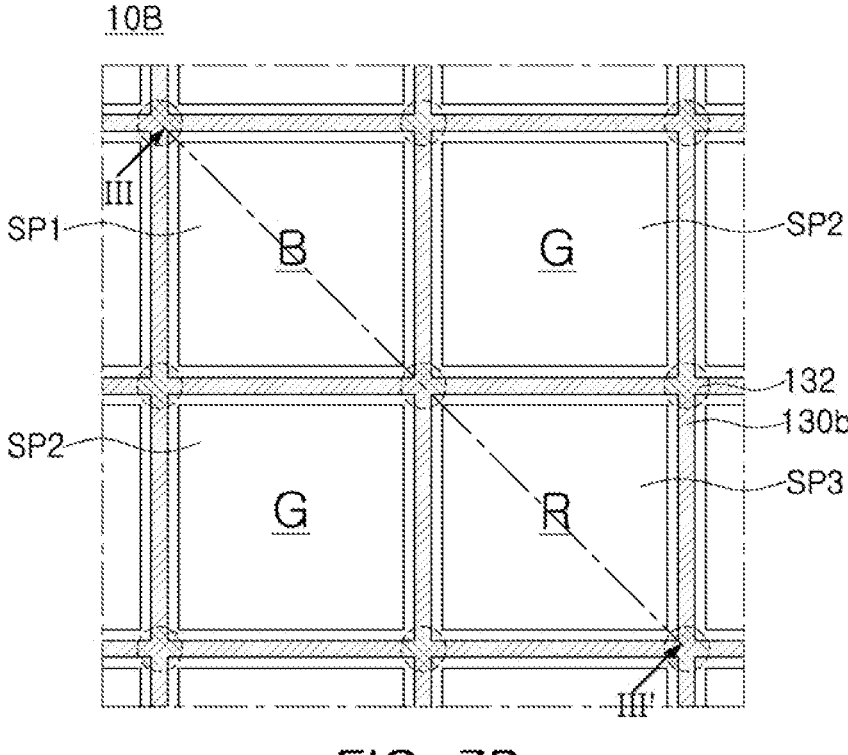
Figure 7C:
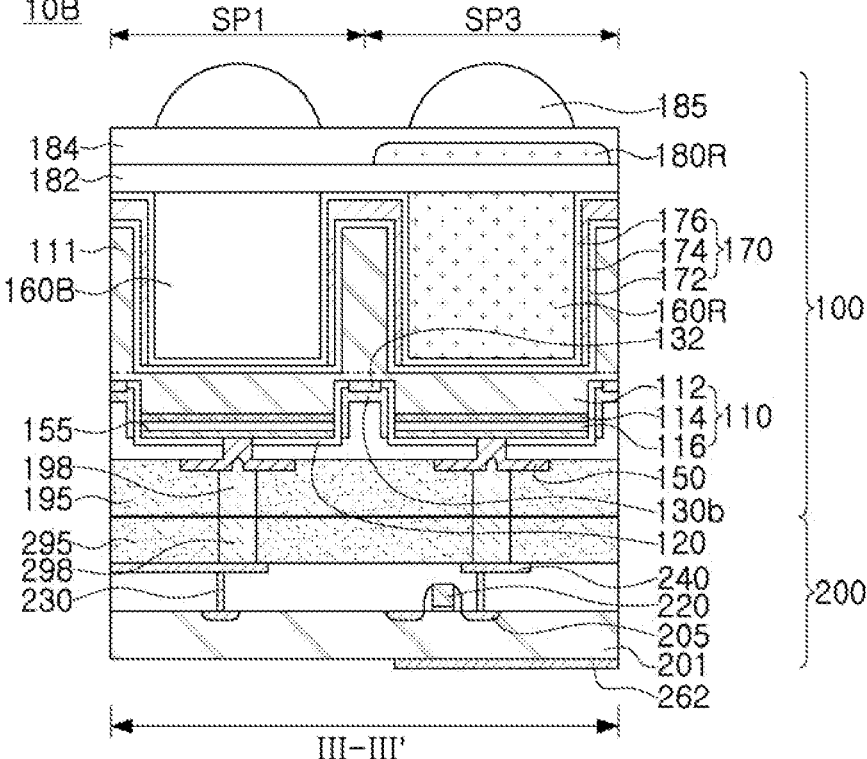

FIGS. 7A to 7C are schematic cross-sectional views and plan views of a display apparatus according to example embodiments. FIG. 7A illustrates a cross-section corresponding to FIG. 3, FIG. 7B illustrates a plan view for one pixel, and FIG. 7C illustrates a cross-section taken along III-III' in FIG. 7B.

Referring to FIGS. 7A to 7C, a display apparatus 10B according to the present example embodiment may be understood as being similar to the display apparatus 10 illustrated in FIGS. 3 and 4, except for employing the ohmic contact layer 132 in a partial region under the first reflective electrode 130b. In addition, the components of the present example embodiment may be understood with reference to descriptions of the same or similar components of the display apparatus 10 illustrated in FIGS. 3 and 4 unless otherwise specified.

The pixel array 100 employed in the present example embodiment may further include an ohmic contact layer 132 connected to the first reflective electrode 130b. The first reflective electrode 130b and the ohmic contact layer 132 may form, e.g., an n-electrode structure together. The first reflective electrode 130b may not be directly connected to the first conductivity-type semiconductor layer 112, but may be connected through the ohmic contact layers 132.

Referring to FIG. 7B, the ohmic contact layer 132 may be positioned at the center of the four first to third sub-pixels SP1, SP2, and SP3 adjacent to each other. For example, the ohmic contact layer 132 may be disposed in an area adjacent to vertices of the four first to third sub-pixels SP1, SP2, and SP3. The ohmic contact layers 132 may be disposed outside the vertices of each of the first to third sub-pixels SP1, SP2, and SP3.

Referring to FIG. 7C, the ohmic contact layers 132 may be interposed between the first conductivity-type semiconductor layer 112 and the first reflective electrode 130b. According to the present example embodiment, even when it is difficult to form the first reflective electrode 130b to be directly connected to the first conductivity-type semiconductor layer 112 in all regions, by disposing the ohmic contact layers 132 in the regions in the diagonal direction of the first to third sub-pixels SP1, SP2, and SP3, which are relatively wide regions, electrical connection may be secured.

The ohmic contact layers 132 may include a highly reflective metal, e.g., at least one of silver (Ag), nickel (Ni), aluminum (Al), chromium (Cr), rhodium (Rh), iridium (Ir), palladium (Pd), ruthenium (Ru), magnesium (Mg), zinc (Zn), platinum (Pt), and gold (Au). The ohmic contact layers 132 may include the same or a different material from the contact layers 155. The ohmic contact layers 132 may also be referred to as a first contact layer, and the contact layers 155 may also be referred to as a second contact layer.

Figure 8:
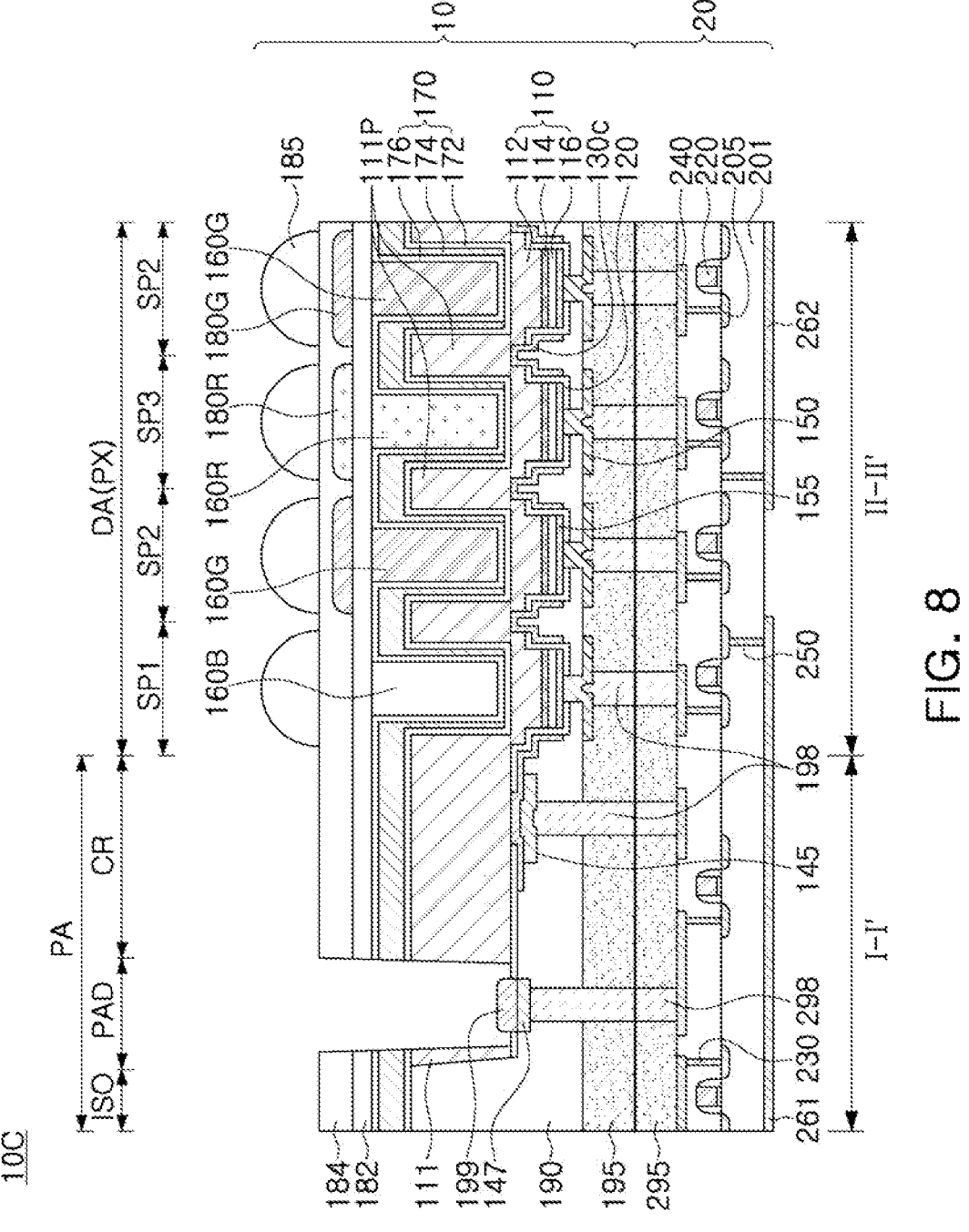
FIGS. 8 and 9 are schematic cross-sectional views of display apparatuses according to various example embodiments, respectively.

FIG. 8 is a schematic cross-sectional view of a display apparatus according to an example embodiment, and may be understood as a cross-section corresponding to the cross-section corresponding to FIG. 3.

Referring to FIG. 8, a display apparatus 10C according to an example embodiment may be understood as being similar to the display apparatus 10 illustrated in FIGS. 3 and 4, except that the structure of the first conductivity-type semiconductor layer 112c of the LED cells 110c and the arrangement of the first reflective electrode 130c accordingly are different therefrom. In addition, the components of the present example embodiment may be understood with reference to descriptions of the same or similar components of the display apparatus 10 illustrated in FIGS. 3 and 4 unless otherwise specified.

In the pixel array 100 employed in the present example embodiment, a plurality of first conductivity-type semiconductor layers 112c may be separated in units of the LED cells 110c between the LED cells 110c. In each of the LED cells 110c, the first conductivity-type semiconductor layer 112c may have a protruding region protruding outwardly, and may contact the first reflective electrode 130c through side surfaces in the protruding region. In an example embodiment, a shape in which the side surfaces of the first conductivity-type semiconductor layer 112c protrude from the side surfaces of the active layer 114 and the second conductivity-type semiconductor layer 116 may be variously changed. In the present example embodiment, the level of the uppermost surface of the first reflective electrode 130c may be substantially the same as the level of the lower surface of the partition reflective layer 170.

Also in the present example embodiment, the first reflective electrode 130c may have a grid shape and may be disposed as one layer. Accordingly, a portion of the first reflective electrode 130c extending to the connection region CR may also be connected to ends of lines of the first reflective electrode 130c extending in the grid form in an area not illustrated. In FIG. 8, the first reflective electrode 130c is illustrated as being connected to the upper semiconductor layer 111 in the connection region CR, but, in the connection region CR, the first reflective electrode 130c may be disposed to be spaced apart from the upper semiconductor layer 111 by the passivation layer 120.

Figure 9:
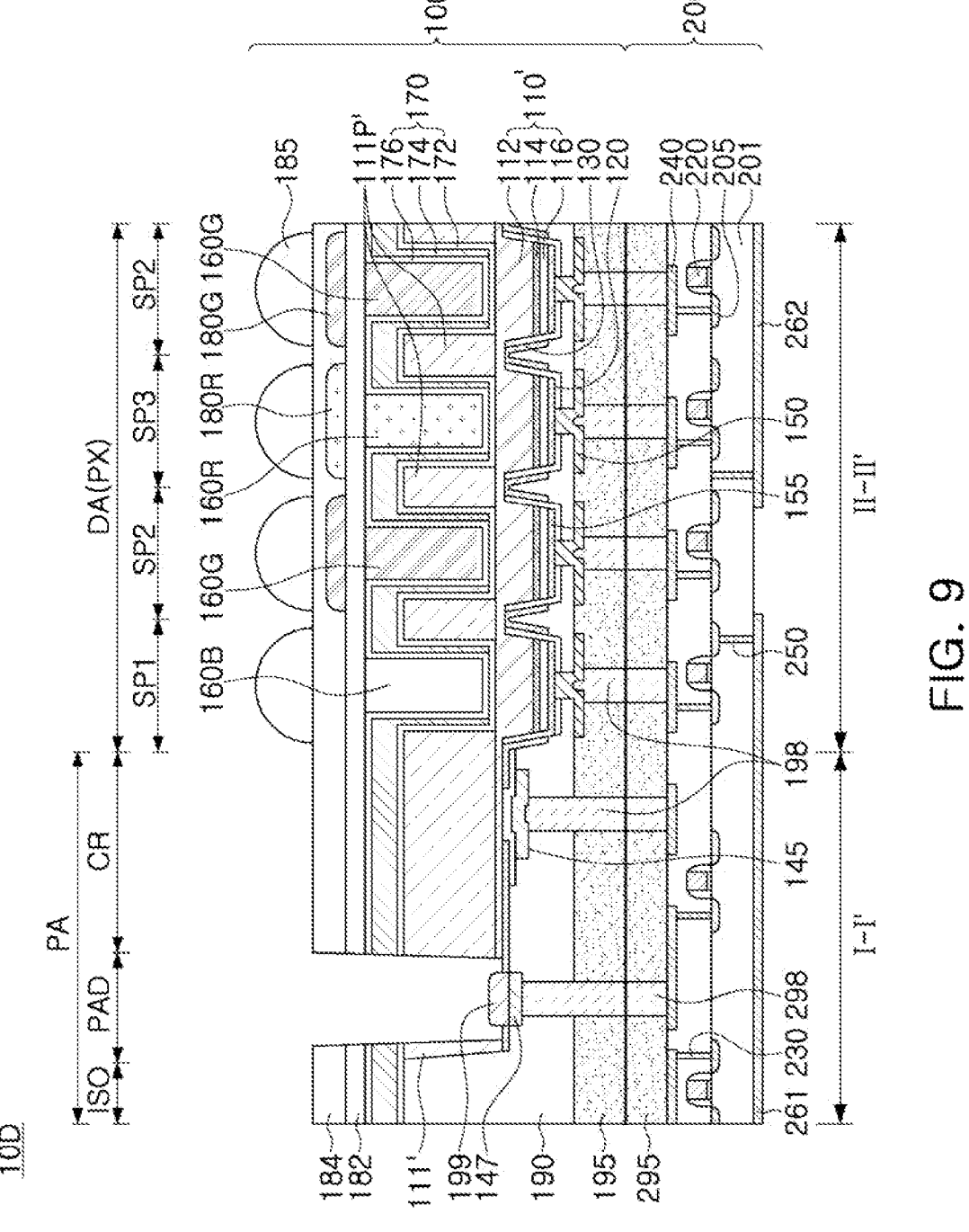

FIG. 9 is a schematic cross-sectional view of a display apparatus according to an example embodiment, and may be understood as a cross-section corresponding to the cross-section corresponding to FIG. 3.

Referring to FIG. 9, a display apparatus 10D according to an example embodiment may be understood as being similar to the display apparatus 10 illustrated in FIGS. 3 and 4, except that the LED cells 110' have a slanted side, and the upper layer 111' is provided as a separate layer rather than an epitaxial layer continuously grown with the epitaxial layers 112, 114, 116 of the LED cells 110'. In addition, the components of the present example embodiment may be understood with reference to descriptions of the same or similar components of the display apparatus 10 illustrated in FIGS. 3 and 4 unless otherwise specified.

In the pixel array 100 employed in the present example embodiment, the LED cells 110' may have slanted sides, differently from the nearly vertical sides of the LED cells of the previous example embodiment. For example, the LED cells 110' according to the present example embodiment may have a structure obtained by omitting a process of removing a damaged region (see FIG. 10B).

Unlike the upper semiconductor layer 111 of the previous example embodiment, an upper layer 111' may be provided as a separate layer rather than as an epitaxial layer continuously grown with the epitaxial layers 112, 114, and 116 of the LED cells 110'. The upper layer 111' according to the present example embodiment may be a layer for providing the partition structure 111P'. In an example embodiment, the upper layer 111' may be a substrate for growing epitaxial layers 112, 114, and 116 of LED cells 110'. The upper layer 111' may be a layer formed of a light-transmitting material for providing the partition structure 111P'.

Also in the present example embodiment, the partition reflective layer 170 may have a thickness of the first portion located on the upper surface of the partition structure 111P, and may be formed to be greater than a thickness of a second portion positioned on the sidewalls of the partition structure 111P. As described above, by forming the partition reflective layer 170 such that the first portion located on the upper surface of the partition structure 111P has a greater thickness than the thickness of the second portion located on the inner sidewall. A sufficient amount of wavelength converting material may be introduced in a sub-pixel space with a relatively low aspect ratio.

FIGS. 10a to 10h are cross-sectional views for respective main processes to illustrate some processes (bonding of a circuit board and a substrate for a pixel array) of a method of manufacturing a display apparatus according to an example embodiment, and may be understood as a manufacturing method for the display apparatus of FIG. 3.

Figures 10A, 10B:
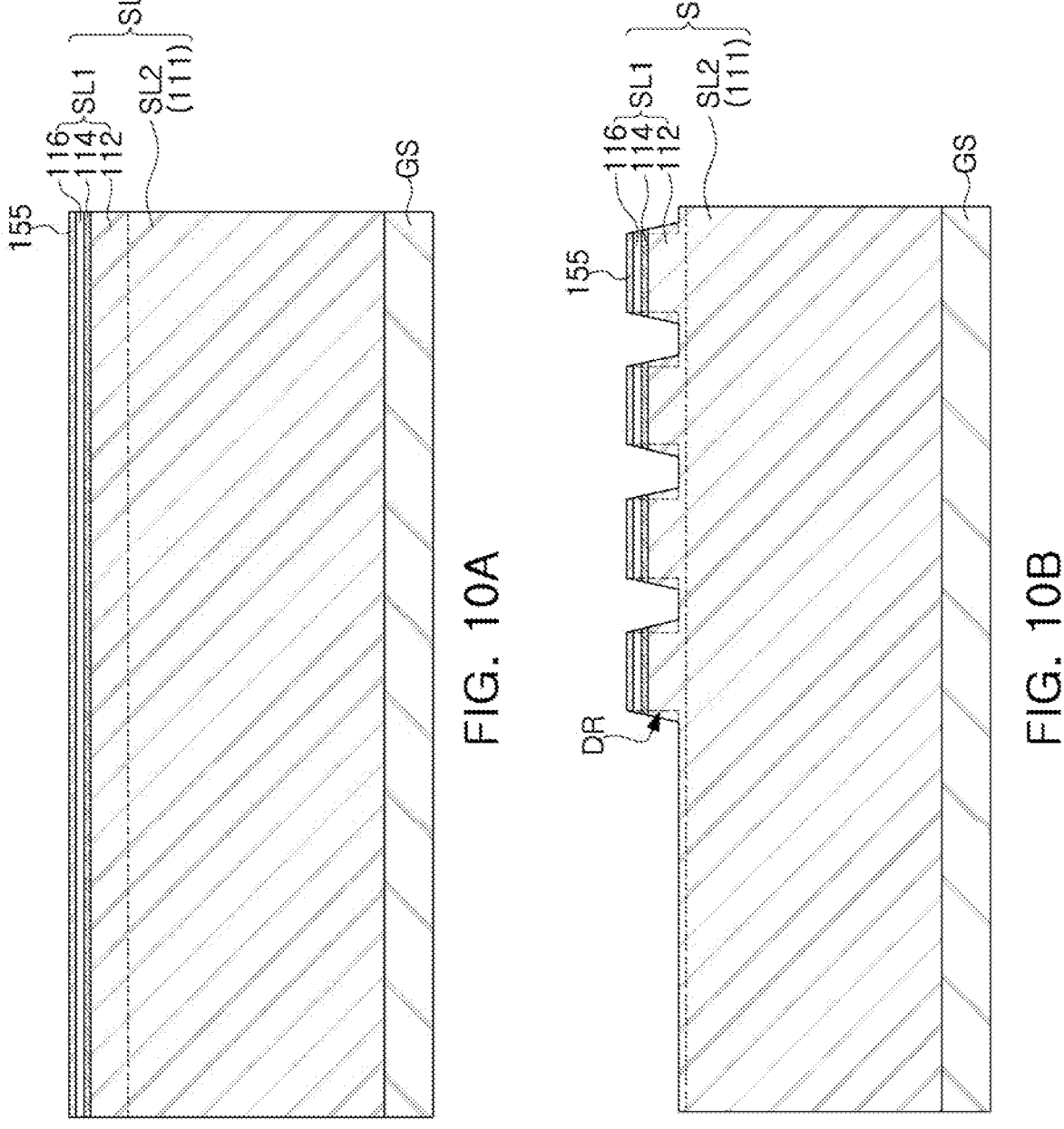
FIGS. 10A to 10H are cross-sectional views for respective main processes to illustrate some processes of a method of manufacturing a display apparatus according to an example embodiment.

Referring to FIG. 10A, an upper semiconductor layer 111, a first conductivity-type semiconductor layer 112, an active layer 114, and a second conductivity-type semiconductor layer 116 may be sequentially formed on a growth substrate GS, and a contact layer 155 may be formed.

The growth substrate GS may be for nitride single crystal growth, and may include at least one of, e.g., sapphire, Si, SiC, MgAl₂O₄, MgO, LiAlO₂, LiGaO₂, and GaN. In an example embodiment, to improve the crystallinity and light extraction efficiency of the semiconductor layers, the growth substrate GS may have a concave-convex structure on at least a portion of its upper surface. In this case, unevenness may be formed in the layers grown thereon.

The upper semiconductor layer 111, the first conductivity-type semiconductor layer 112, the active layer 114, and the second conductivity-type semiconductor layer 116 may be formed by, e.g., Metal Organic Chemical Vapor Deposition (MOCVD), hydrogen vapor phase epitaxy (HVPE), or molecular beam epitaxy (MBE) process. The first conductivity-type semiconductor layer 112 may be an n-type nitride semiconductor layer such as n-type GaN, and the second conductivity-type semiconductor layer 116 may be a p-type nitride semiconductor layer such as p-type GaN/p-type AlGaN. The active layer 114 may have a multi-quantum well structure such as InGaN/GaN. In an example embodiment, the upper semiconductor layer 111 may include a buffer layer and an undoped nitride layer (e.g., GaN). In this case, the buffer layer may help to alleviate lattice defects of the first conductivity-type semiconductor layer 112, and may include an undoped nitride semiconductor such as undoped GaN, undoped AlN, and undoped InGaN. The contact layer 155 may be formed on the upper surface of the second conductivity-type semiconductor layer 116. For example, the contact layer 155 may be a highly reflective ohmic contact layer.

Then, referring to FIG. 10B, by etching the stack structure of the first conductivity-type semiconductor layer 112, the active layer 114, the second conductivity-type semiconductor layer 116, and the contact layer 155, the LED cells 110 may be formed.

In this operation, a portion of the stack structure may be removed by a dry etching process to be separated into units of first to third sub-pixels SP1, SP2, and SP3 (refer to FIG. 3). In this operation, the stack structure may be etched to have an inclined side surface. In addition, some damaged regions DR may be formed on the side surfaces of the LED cells 110 by the dry etching process.

Figures 10C, 10D:
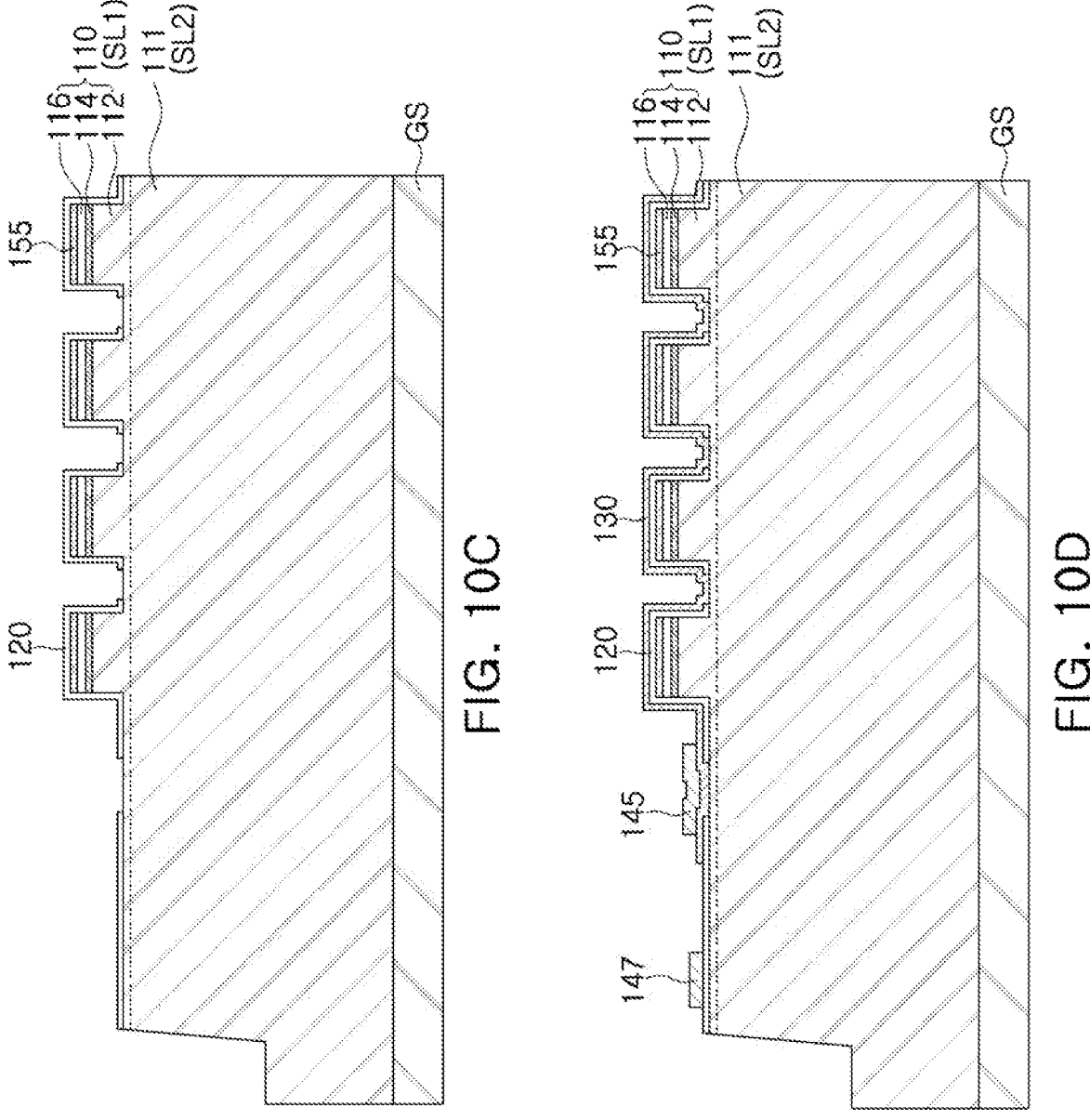

Next, referring to FIG. 10C, the damaged regions DR may be removed from the LED cells 110, a passivation layer 120 may be formed on the LED cells 110, and the upper semiconductor layer 111 may be partially removed from the edge region ISO.

The damaged regions DR may be selectively removed by, e.g., a wet etching process. In the wet etching process, only the damaged regions DR may be selectively removed by controlling process conditions such that the selectivity between the crystal planes is different in the etching. Thereby, the LED cells 110 may have a vertical angle between the upper surface and the side surfaces or close to the vertical angle, and non-radiative recombination by the damaged regions DR may be reduced, such that luminance may be improved.

Then, the passivation layer 120 may be formed on the upper surface of the stack structure to a uniform thickness, and then, a partial region, the regions in which the first reflective electrode 130 (refer to FIG. 3) is to be formed, may be removed. The passivation layer 120 may include, e.g., at least one of $SiO_2$, SiN, SiCN, SiOC, SiON, and SiOCN. The passivation layer 120 may be formed conformally, and accordingly, may have a substantially uniform thickness.

In the edge region ISO, the semiconductor layer constituting the upper semiconductor layer 111 and the first conductivity-type semiconductor layer 112 may be removed to a predetermined depth. The edge region ISO is a cut area in a subsequent process, and may be an area for separating modules. Accordingly, the semiconductor layer may be partially removed in this operation to prevent cracks from occurring in the cutting or dicing process.

Next, referring to FIG. 10D, the first reflective electrode 130, the common electrode 145, and the first pad electrode 147 may be formed.

First, the first reflective electrode 130 may be conformally formed on the passivation layer 120 and the first conductivity-type semiconductor layer 112. Accordingly, the first reflective electrode 130 may have a substantially uniform thickness. The first reflective electrode 130 may be formed in the region where the pixels PX of FIG. 3 are disposed and in the connection region CR.

Next, the common electrode 145 and the first pad electrode 147 may be respectively formed in the connection region CR and the pad areas PAD of FIG. 3. The common electrode 145 may be formed on the first reflective electrode 130, and the first pad electrode 147 may be formed on the passivation layer 120. The common electrode 145 and the first pad electrode 147 may be formed together through the same process. The first reflective electrode 130, the common electrode 145, and the first pad electrode 147 may include a conductive material, e.g., a metal.

Figure 10E:
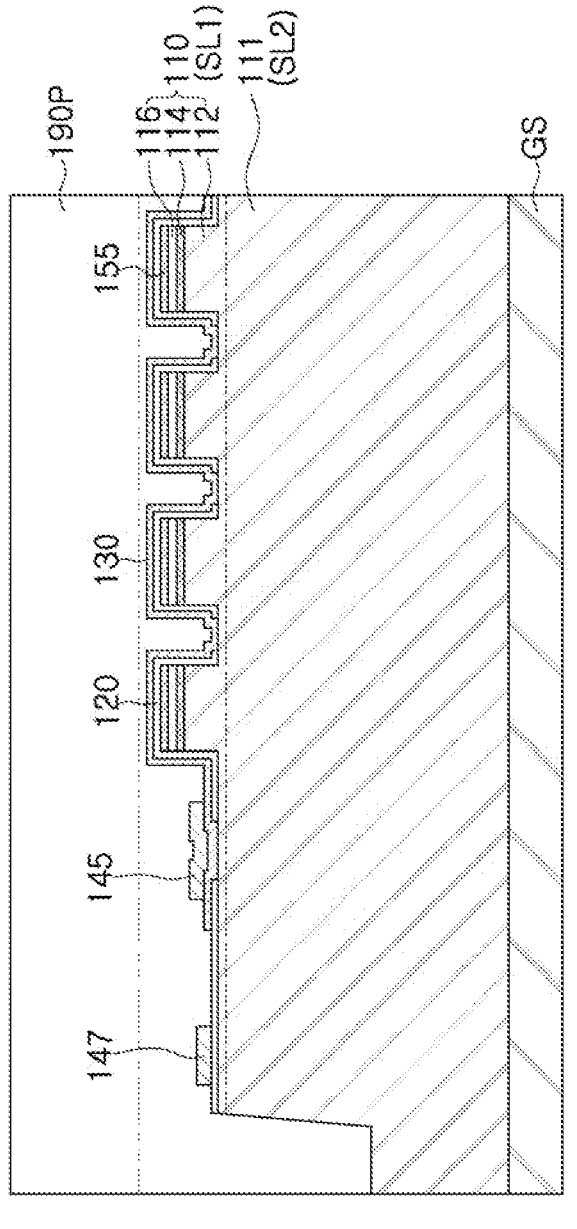

Referring to FIG. 10E, the wiring insulating layer 190 may be formed by forming the preliminary wiring insulating layer 190P and removing a portion of the preliminary wiring insulating layer 190P indicated by a dotted line.

The preliminary wiring insulating layer 190P may be formed to cover all the structures formed in the previous steps, including the first reflective electrode 130. The preliminary wiring insulating layer 190P may be, e.g., a low dielectric material such as silicon oxide.

The preliminary wiring insulating layer 190P may be formed using, e.g., a planarization process such as a chemical mechanical polishing (CMP) process or an etch-back process. A portion may be removed to form the wiring insulating layer 190 having a flat upper surface indicated by a dotted line. In the process of removing the preliminary wiring insulating layer 190P, the first reflective electrode 130 may also be removed from the upper surfaces of the LED cells 110 and remain only on the side surfaces of the LED cells 110.

Figure 10F:
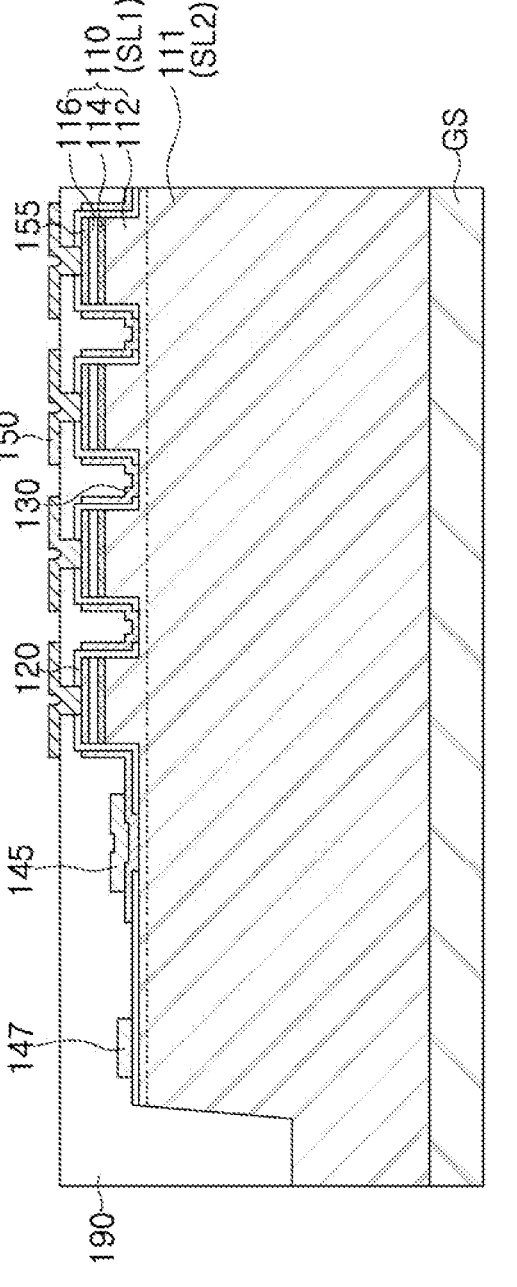

Referring to FIG. 10F, second reflective electrodes 150 connected to the contact layers 155 may be formed.

First, the wiring insulating layer 190 may be additionally formed, and contact holes passing through the wiring insulating layer 190 and the passivation layer 120 to expose the contact layers 155 may be formed. By filling the contact holes with a conductive material, contact layers 155 that fill the contact holes and extend to the upper surface of the wiring insulating layer 190 may be formed.

Figure 10G:
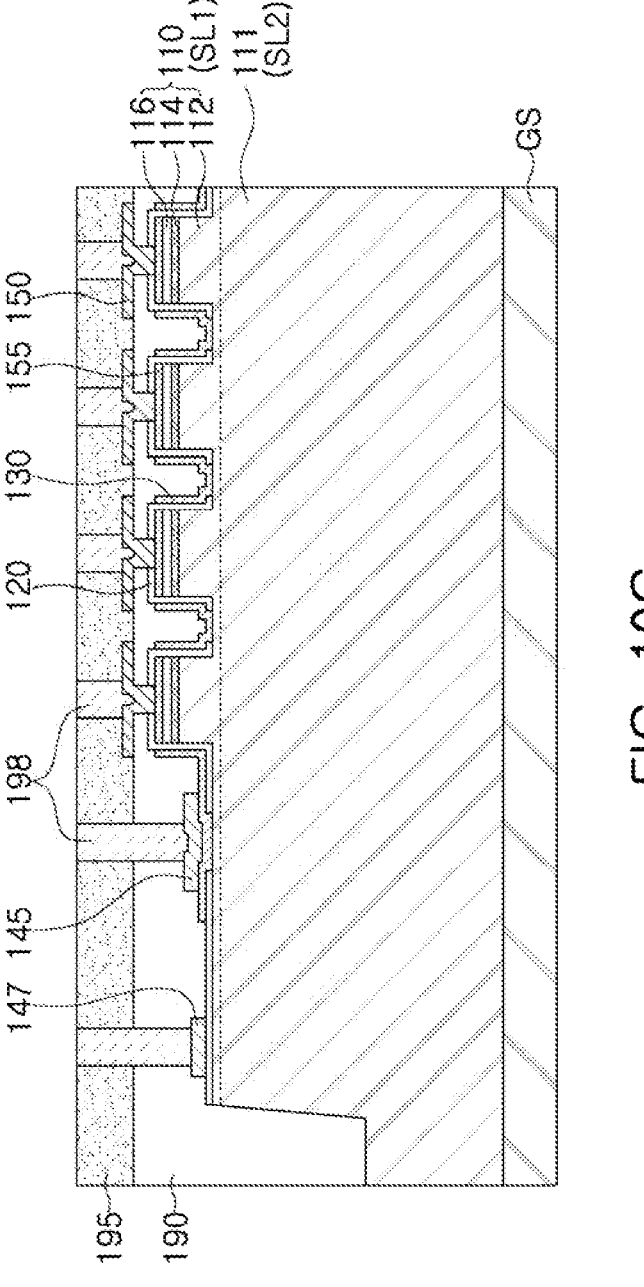

Referring to FIG. 10G, a second bonding insulating layer 195 may be formed on the second reflective electrodes 150, and second bonding electrodes 198 may be formed.

The second bonding insulating layer 195 may include the same or a different material as the wiring insulating layer 190. In addition, even when the second bonding insulating layer 195 includes a material different from that of the wiring insulating layer 190, the thickness of the second bonding insulating layer 195 may be variously changed within a range where the second bonding insulating layer 195 forms the upper surface of the pixel array 100 (refer to FIG. 3), in example embodiments.

The second bonding electrodes 198 may be formed by forming via holes penetrating the second bonding insulating layer 195 and the wiring insulating layer 190 and then filling the via holes with a conductive material. The second bonding electrodes 198 may be formed to be connected to the second reflective electrodes 150, the common electrode 145, and the first pad electrode 147.

Figure 10H:
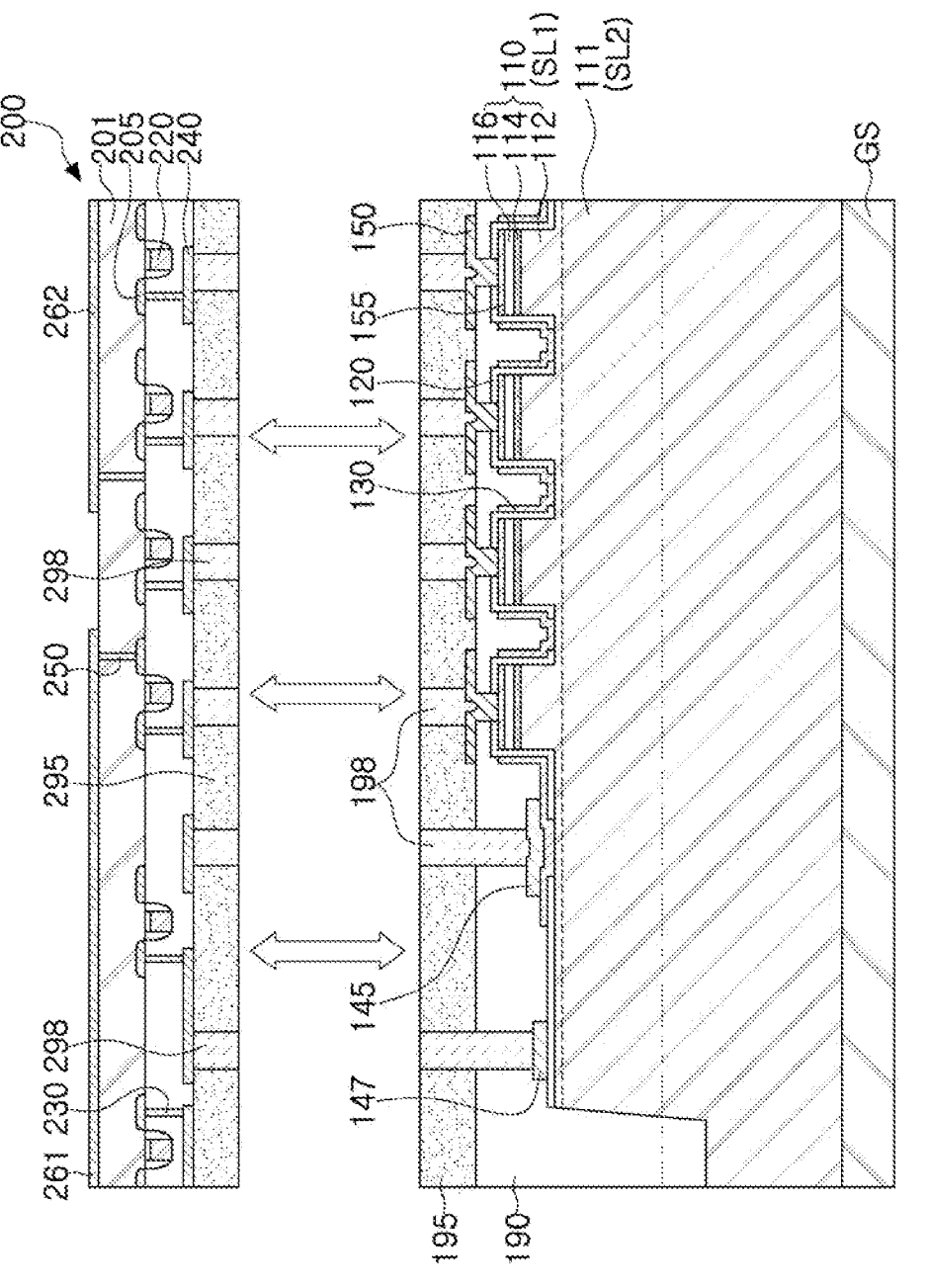

Referring to FIG. 10H, the structure including the LED cells 110 and the circuit board 200 may be bonded.

First, the circuit board 200 may be prepared through a separate process. The structure and the circuit board 200 may be bonded at a wafer level by a wafer bonding method, e.g., the hybrid bonding described above. The first bonding electrodes 298 may be bonded to the second bonding electrodes 198, and the first bonding insulating layer 295 may be bonded to the second bonding insulating layer 195. Accordingly, the structure including the LED cells 110 and the circuit board 200 may be bonded without a separate adhesive layer.

FIGS. 11A to 11F are cross-sectional views for respective main processes to illustrate some processes (pixel array manufacturing process) of a method of manufacturing a display apparatus according to an example embodiment, and may be understood as subsequent processes of the process of FIG. 10H.

Figure 11A:
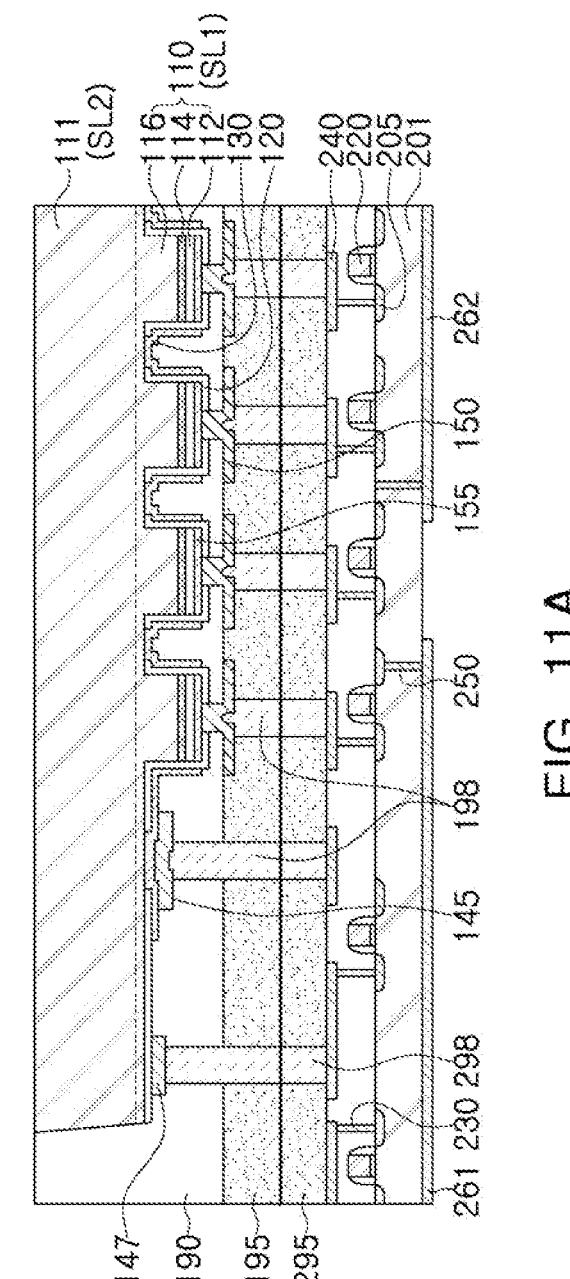
FIGS. 11A to 11F are cross-sectional views for respective main processes to illustrate some other processes of a method of manufacturing a display apparatus according to an example embodiment.

Referring to FIG. 11A, the growth substrate GS may be removed on the upper semiconductor layer 111, and the upper semiconductor layer 111 may be partially removed. In the following drawings, for better understanding, a structure including the LED cells 110 is illustrated in a bonded state in a mirror image of the structure illustrated in FIG. 10H.

The growth substrate GS may be removed by various processes such as laser lift-off, mechanical polishing or mechanical chemical polishing, and an etching process.

The upper semiconductor layer 111 may be partially removed to reduce a predetermined thickness using, e.g., a polishing process such as CMP. In a comparative device, the height of the upper surface of the wavelength converters (160R, 160G, and 160B in FIG. 11C) may be substantially defined by the height of the upper semiconductor layer 111. However, in the present example embodiment, the level to which the wavelength converter may be filled may also be determined by using the thickness of the partition reflective layer (refer to 170 in FIG. 11C). Also, the upper semiconductor layer 111 may be removed so as not to remain in the edge region (ISO in FIG. 3).

Figure 11B:
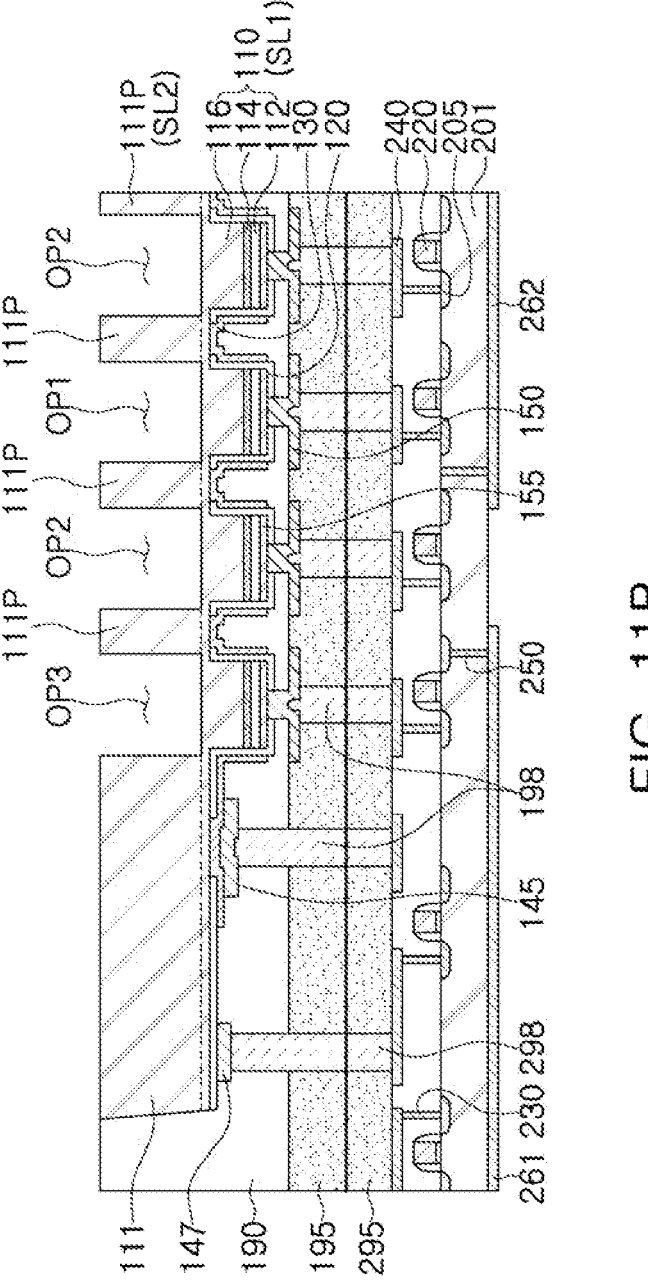

Next, referring to FIG. 11B, the partition structure 111P defining the sub-pixel spaces OP1, OP2, and OP3 may be formed using the upper semiconductor layer 111.

The partition structure 111P may be formed by using an etching process for forming openings in regions corresponding to LED cells in the upper semiconductor layer 111. Each of the openings may provide the first to third sub-pixels (SP1, SP2, and SP3 of FIG. 3) to the corresponding first to third sub-pixel spaces OP1, OP2, and OP3. A space for forming the first to third sub-pixel spaces OP1, OP2, and OP3 wavelength converters (160R, 160G, and 160B of FIG. 3) may be provided.

According to the trend of display miniaturization and high resolution, since the widths of the first to third sub-pixel spaces OP1, OP2, and OP3 tend to be narrow, it may be considered to increase the depth of the first to third sub-pixel spaces OP1, OP2, and OP3 to accommodate a sufficient amount of the wavelength conversion material for sufficient conversion efficiency. However, if the aspect ratio of the sub-pixel spaces OP1, OP2, and OP3 is too large, the side step coverage of the reflective layer to be formed on the inner sidewalls and the upper surface of the partition structure 111P may be too low. Thus, there may be a problem in which the reflective layer is not correctly formed on the lower end of the inner sidewall and a light leakage defect occurs.

In the present example embodiment, the depth of the first to third sub-pixel spaces OP1, OP2, and OP3 may be determined such that the upper semiconductor layer 111 is not completely separated between the LED cells 110. As a result, the upper semiconductor layer 111 may be continuously connected between the upper surface of the first reflective electrode 130 and the bottom surfaces of the first to third sub-pixel spaces OP1, OP2, and OP3, thereby connecting the plurality of LED cells 110 to each other.

Figure 11C:
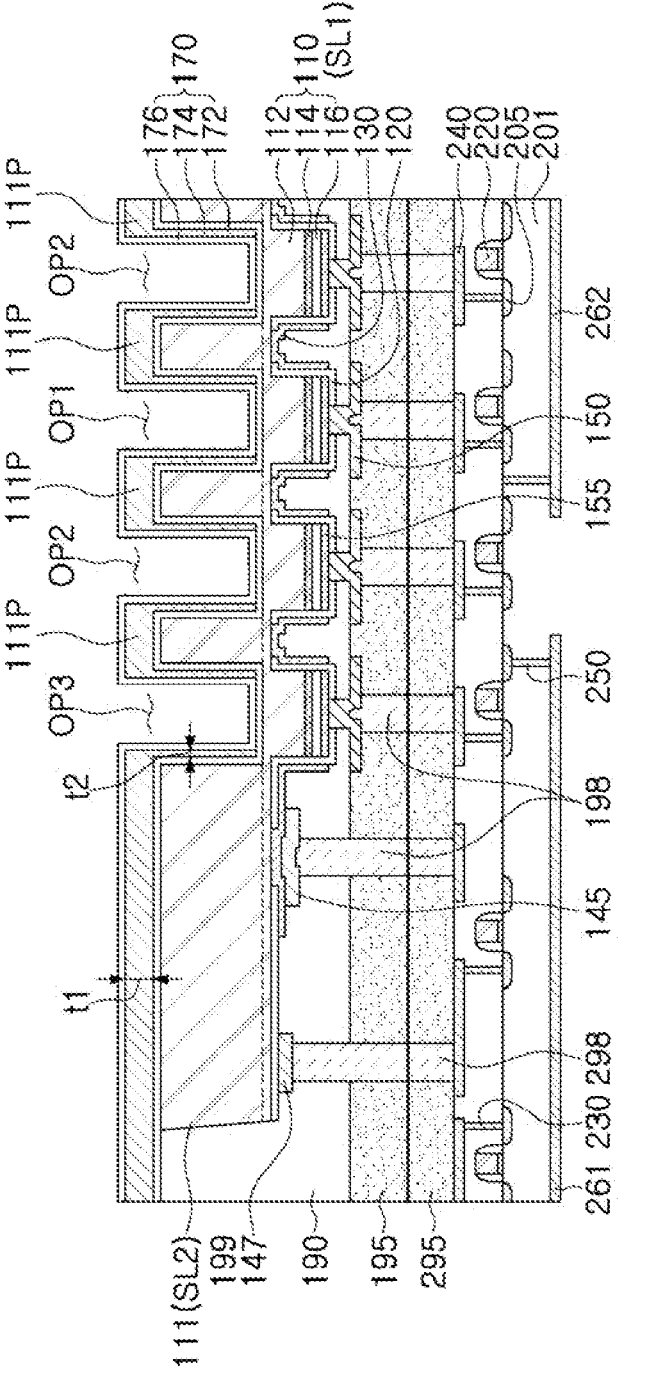

Next, referring to FIG. 11C, the partition reflective layer 170 may be formed on the partition structure 111P.

A first partition insulating film 172 and a reflective metal film 174 may be formed. After removing the reflective metal film 174 from the bottom surfaces of the first to third sub-pixel spaces OP1, OP2, and OP3, the second partition insulating film 176 may be formed, thereby forming the partition reflective layer 170.

The first and second partition insulating films 172 and 176 may be formed using an atomic layer deposition (ALD) method such that the first and second partition insulating films 172 and 176 may have substantially the same thickness on the upper surface and sidewalls of the partition structure 111P, respectively. On the other hand, the reflective metal film 174 may be formed using sputtering or CVD process, and the reflective metal film 174 may be formed such that the thickness t1 of the first portion positioned on the upper surface of the partition structure 111P is greater than the thickness t2 of the second portion positioned on the sidewall.

As described above, by forming the reflective metal film 174 such that the first portion has a thickness t1 that is greater than the thickness t2 of the second portion, although the first to third sub-pixel spaces OP1, OP2, and OP3 formed in FIG. 11B may have a relatively low aspect ratio, there may still be provided a space of sufficient height to accommodate a sufficient amount of wavelength converting material. Conditions of the thicknesses t1 and t2 of the first and second portions may be understood with reference to the description described with reference to FIG. 4.

Figure 11D:
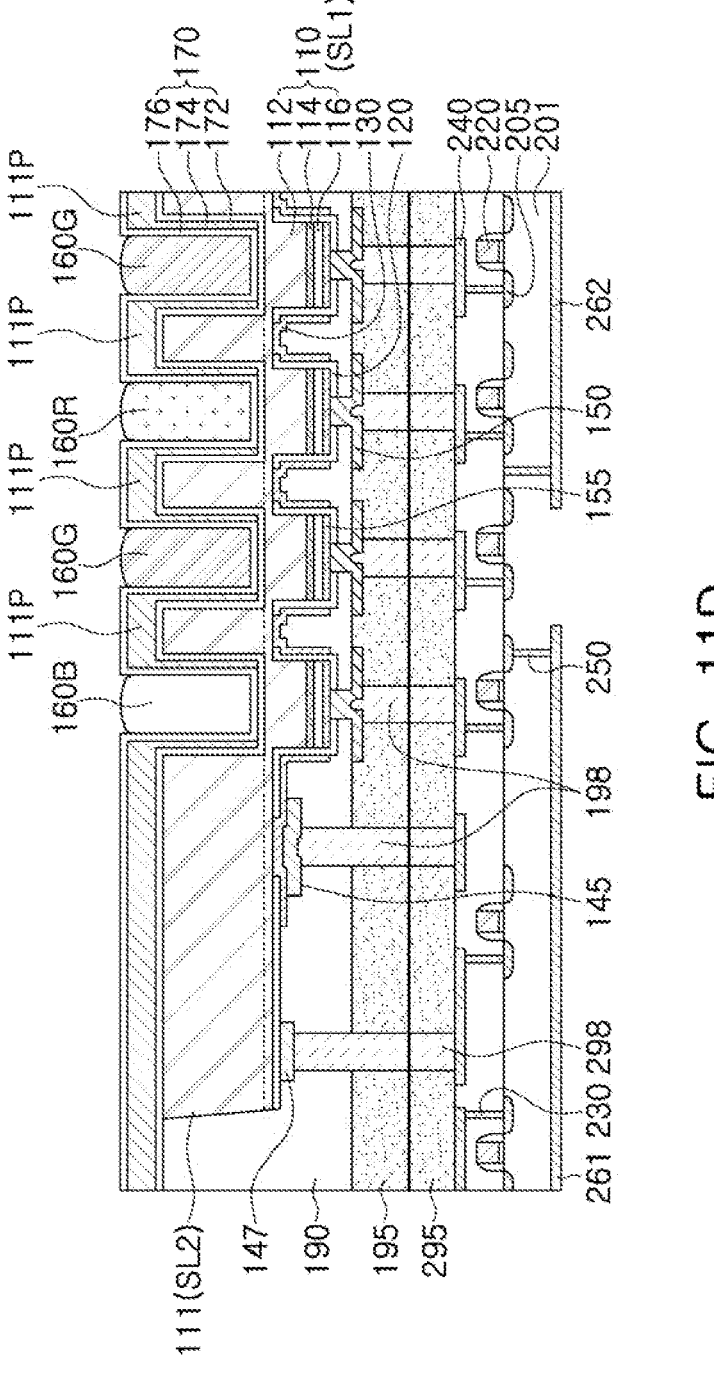

Next, referring to FIG. 11D, the wavelength converters 160R, 160G, and 160B may be formed in the first to third sub-pixel spaces OP1, OP2, and OP3.

In the present example embodiment, the first and second wavelength converters 160R and 160G may be formed by forming a transparent resin mixed with a wavelength conversion material in the first and second sub-pixel spaces OP1 and OP2. The wavelength conversion material may convert blue light emitted from the LED cells 110 into red light and green light in the first and second wavelength converters 160R and 160G, respectively. In addition, on the third sub-pixel space OP3, a third wavelength converter 160B (a transparent resin unit and not a wavelength conversion material in a strict sense) formed of a transparent resin may be formed. The transparent resin used in this process may include, e.g., a transparent resin such as a silicone resin or an epoxy resin. In an example embodiment, the wavelength converters 160R, 160G, and 160B may use silicon oxide such as $SiO_2$ instead of a transparent resin.

As described above, even when the first and second sub-pixel spaces OP1 and OP2 have a low depth (or height), a reflective metal film having a relatively large thickness may be introduced on the upper surface of the partition structure 111P, and a sufficient amount of a wavelength conversion material to obtain required wavelength conversion efficiency may be accommodated in the first and second sub-pixel spaces OP1 and OP2.

Figure 11E:
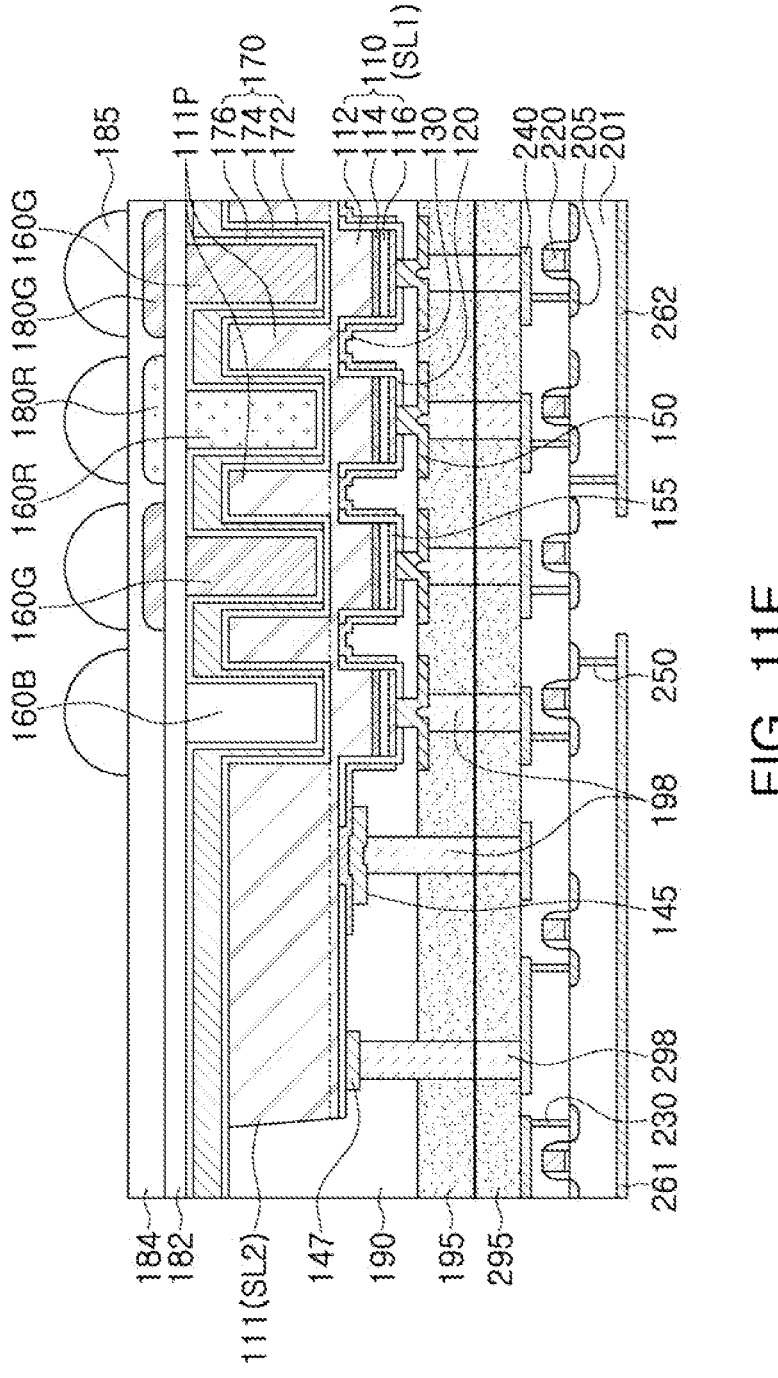

Next, referring to FIG. 11E, color filters 180R and 180G, and microlenses 185 may be formed on the wavelength converters 160R, 160G, and 160B.

First, an encapsulation layer 182 may be formed on the wavelength converters 160R, 160G, and 160B to protect the wavelength converters 160R, 160G, and 160B from moisture and oxygen. The color filters 180R and 180G may be formed on the first and second wavelength converters 160R and 160G, respectively.

According to an example embodiment, a color filter may also be formed on the third wavelength converter 160B.

Next, a planarization layer 184 covering the color filters 180R and 180G may be formed, and the microlenses 185 may be formed.

Figure 11F:
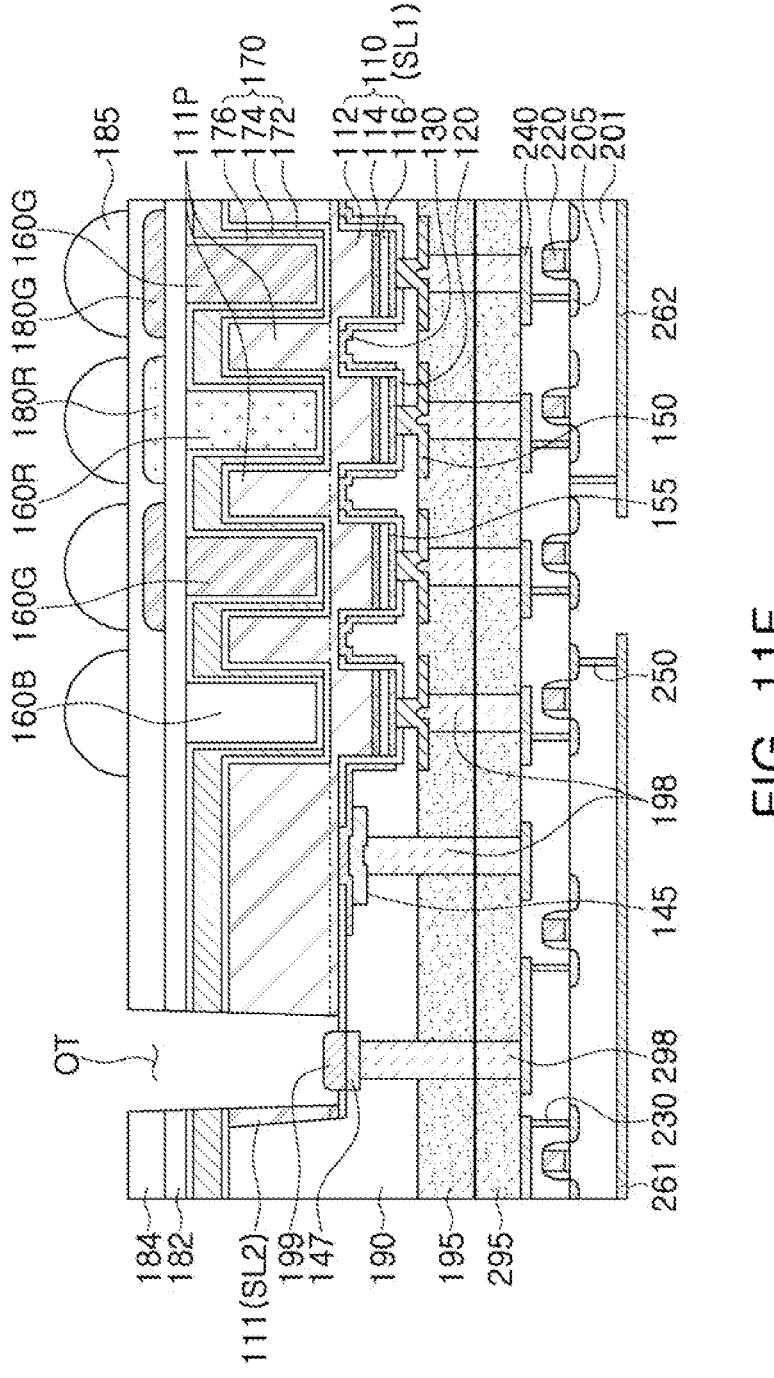

Next, referring to FIG. 11F, an opening OT may be formed by removing the upper semiconductor layer 111 and the first conductivity-type semiconductor layer 112 on the first pad electrode 147. The opening OT may be formed to expose the passivation layer 120 on the first pad electrode 147 in the pad areas PAD of FIG. 3. Next, after partially removing the passivation layer 120 exposed through the opening OT, a second pad electrode 199 may be formed, and by dicing adjacent modules in the edge region (ISO), finally the display apparatus 10 may be manufactured (refer to FIG. 3).

Figure 12:
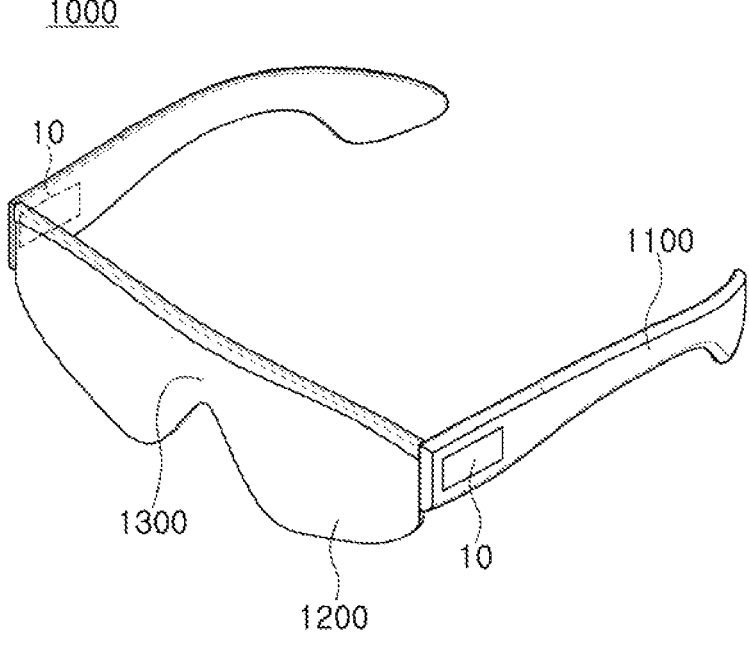
FIG. 12 is a conceptual diagram of an electronic device including a display apparatus according to an example embodiment.

FIG. 12 is a conceptual diagram of an electronic device including a display apparatus according to an example embodiment.

Referring to FIG. 12, an electronic device 1000 according to the present example embodiment may be a glasses-type display that is a wearable device. The electronic device 1000 may include a pair of temples 1100, a pair of light coupling lenses 1200, and a bridge 1300. The electronic device 1000 may further include a display apparatus 10 including an image generator.

The electronic device 1000 may provide a virtual reality or provide a virtual image and an external real landscape together, and may be a head-mounted, glasses-type, goggles-type virtual reality (VR), augmented reality (AR) device, or mixed reality (MR) device.

The temples 1100 may extend in one direction. The temples 1100 may be spaced apart from each other and extend in parallel. The temples 1100 may be folded toward the bridge 1300. The bridge 1300 may be provided between the light coupling lenses 1200 to connect the light coupling lenses 1200 to each other. The light coupling lenses 1200 may include a light guide plate. The display apparatus 10 may be respectively disposed on the temples 1100, and may generate images on the light coupling lenses 1200. The display apparatus 10 may be a display apparatus according to the example embodiments described above with reference to FIGS. 1 to 9.

As described above, embodiments relate to a display apparatus having a micro LED.

As set forth above, according to an example embodiment, by forming a partition reflective layer such that the first portion located on the upper surface of the partition structure has a thickness greater than the thickness of the second portion located on the inner sidewall, a sufficient amount of wavelength converting material may be introduced in a sub-pixel space having a relatively low aspect ratio.

Example embodiments may provide a high-efficiency display apparatus that may be manufactured with a simplified process.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display apparatus, comprising:
a circuit board having a driving circuit; and
a pixel array on the circuit board, and including pixel units, each of the pixel units having a plurality of sub-pixels and a plurality of light emitting diode (LED) cells respectively corresponding to the plurality of sub-pixels, the pixel array further including:

a semiconductor stack including a first semiconductor region on the circuit board and a second semiconductor region on the first semiconductor region, wherein:
the first semiconductor region is divided into a plurality of portions, the plurality of divided portions respectively provided to the plurality of LED cells, and
the second semiconductor region includes a partition structure defining a plurality of sub-pixel spaces, the plurality of sub-pixel spaces respectively corresponding to the plurality of LED cells;
a plurality of wavelength converters respectively disposed in the plurality of sub-pixel spaces;
a partition reflective layer having a first portion on an upper surface of the partition structure, and a second portion on sidewalls of the partition structure, the first portion having a thickness that is greater than a thickness of the second portion, wherein the thickness of the first portion is in a direction perpendicular to, and overlapping, the upper surface of the partition structure, and the thickness of the second portion is in a direction perpendicular to a respective sidewall of the partition structure;
a passivation layer on lower surfaces and side surfaces of the plurality of LED cells; and
a first electrode and a second electrode on the passivation layer, and electrically connecting each of the plurality of LED cells to the driving circuit.

2. The display apparatus as claimed in claim 1, wherein the plurality of wavelength converters has an upper surface that is higher than the upper surface of the partition structure.

3. The display apparatus as claimed in claim 1, wherein:
the partition reflective layer includes a first partition insulating film, a reflective metal film, and a second partition insulating film sequentially stacked on the upper surface and sidewalls of the partition structure, and
a first thickness of the reflective metal film in the first portion is greater than a second thickness of the reflective metal film in the second portion, wherein the first thickness is measured along a first axis that passes through the upper surface of the partition structure, and the second thickness is measured along a second axis that passes through the respective sidewall of the partition structure.

4. The display apparatus as claimed in claim 3, wherein the second thickness is defined as a thickness on an upper end of the second portion, and the first thickness of the reflective metal film is 2 or more times the second thickness.

5. The display apparatus as claimed in claim 3, wherein the second thickness is defined as a thickness on a lower end of the second portion, and the first thickness of the reflective metal film is 10 or more times the second thickness.

6. The display apparatus as claimed in claim 1, wherein the second semiconductor region includes the same semiconductor material as that of a semiconductor layer of the first semiconductor region adjacent to the second semiconductor region.

7. The display apparatus as claimed in claim 1, wherein the first semiconductor region includes:
a first conductivity-type semiconductor layer adjacent to the second semiconductor region and shared by the plurality of LED cells; and
a plurality of active layers and a plurality of second conductivity-type semiconductor layers sequentially disposed to configure the plurality of LED cells on a lower surface of the first conductivity-type semiconductor layer.

8. The display apparatus as claimed in claim 1, wherein each of the pixel units has four sub-pixels, and the pixel array further includes an ohmic contact layer connected to the first electrode and disposed on a center of the four sub-pixels in each of the plurality of sub-pixels.

9. The display apparatus as claimed in claim 1, wherein the side surfaces of the plurality of LED cells each have an angle of about 85° to about 95°.

10. A display apparatus, comprising:

a circuit board having a driving circuit, and first bonding electrodes connected to the driving circuit; and a pixel array on the circuit board, and having a display area in which pixel units are arranged, and a peripheral area adjacent to the display area, each of the pixel units including a plurality of sub-pixels, the pixel array including:

a plurality of LED cells arranged to correspond to the plurality of sub-pixels in the display area, each of the plurality of LED cells including a first conductivity-type semiconductor layer, an active layer, and a second conductivity-type semiconductor layer;

a partition structure on the plurality of LED cells, and providing a plurality of sub-pixel spaces in regions respectively corresponding to the plurality of LED cells;

a plurality of wavelength converters in the plurality of sub-pixel spaces, respectively;

a partition reflective layer having a first portion on an upper surface of the partition structure, and a second portion on sidewalls of the partition structure, the first portion having a thickness that is greater than a thickness of the second portion, wherein the thickness of the first portion is in a direction perpendicular to, and overlapping, the upper surface of the partition structure, and the thickness of the second portion is in a direction perpendicular to a respective sidewall of the partition structure;

a passivation layer on lower surfaces and side surfaces of the plurality of LED cells;

a first reflective electrode on the passivation layer, extending along a region between the plurality of LED cells, and electrically connected to the first conductivity-type semiconductor layer of each of the plurality of LED cells;

second bonding electrodes respectively disposed on the first reflective electrode and respectively connected to the first bonding electrodes;

second reflective electrodes respectively disposed on the lower surfaces of the plurality of LED cells, and respectively electrically connected to the second conductivity-type semiconductor layer of each of the plurality of LED cells;

a common electrode in the peripheral area and connected to the second reflective electrodes; and a pad electrode in the peripheral area and electrically connected to the driving circuit.

11. The display apparatus as claimed in claim 10, wherein the plurality of wavelength converters have upper surfaces that are higher than the upper surface of the partition structure.

12. The display apparatus as claimed in claim 10, wherein:

the partition reflective layer includes a first partition insulating film, a reflective metal film, and a second partition insulating film sequentially stacked on the upper surface and sidewalls of the partition structure, a thickness of the reflective metal film in the first portion is greater than a thickness of the reflective metal film in the second portion, and the first and second partition insulating films have the same thickness in the first portion and the second portion, respectively.

13. The display apparatus as claimed in claim 12, wherein:

the plurality of LED cells include a first LED cell and a second LED cell adjacent to each other, and the first reflective electrode extends from one side surface of the first LED cell to a side surface of the second LED cell, facing the one side surface.

14. The display apparatus as claimed in claim 13, wherein:

the plurality of LED cells are arranged in a plurality of columns and a plurality of rows, and the first reflective electrode is disposed as a single layer having a grid shape.

15. The display apparatus as claimed in claim 10, wherein the first reflective electrode is disposed on the passivation layer to fill a space between the plurality of LED cells.

16. The display apparatus as claimed in claim 10, wherein:

the circuit board further includes a first bonding insulating layer surrounding the first bonding electrodes and forming an upper surface of the circuit board, and the pixel array further includes a second bonding insulating layer forming a lower surface of the pixel array while surrounding the second bonding electrodes, and bonded to the first bonding insulating layer.

17. The display apparatus as claimed in claim 10, wherein the pixel array further includes a third bonding electrode disposed on the common electrode, connected to any one of the first bonding electrodes, and having a height that is greater than a height of the second bonding electrodes.

18. The display apparatus as claimed in claim 10, wherein the first conductivity-type semiconductor layer is connected between the plurality of LED cells to each other and is a single layer.

19. The display apparatus as claimed in claim 10, wherein the pad electrode is exposed through an opening penetrating the peripheral area of the pixel array.

20. A display apparatus, comprising:

a circuit board including a driving circuit and first bonding electrodes; and a pixel array on the circuit board, and having pixel units, each of the pixel units including a plurality of sub-pixels, the pixel array including:

a plurality of LED cells arranged to correspond to the plurality of sub-pixels, each of the plurality of LED cells including a first conductivity-type semiconductor layer, an active layer, and a second conductivity-type semiconductor layer sequentially stacked on the circuit board;

wavelength converters on upper surfaces of the plurality of LED cells;

a partition structure on the upper surfaces of the plurality of LED cells, surrounding side surfaces of the wavelength converters, and separating the wavelength converters from each other;

a partition reflective layer extending along an upper surface of the partition structure and extending along sidewalls of the partition structure, the partition reflective layer having a thickness above the upper surface of the partition structure in a vertical direction that is greater than a thickness of the partition reflective layer in a horizontal direction adjacent to one of the sidewalls of the partition structure;

second bonding electrodes connected to the first bonding electrodes;

a first reflective electrode connected to the first conductivity-type semiconductor layer of each of the plurality of LED cells, and connected to the driving circuit through a portion of the first and second bonding electrodes; and second reflective electrodes connected to the second conductivity-type semiconductor layer of each of the plurality of LED cells, and connected to the driving circuit through other portions of the first and second bonding electrodes.

\* \* \* \* \*